(12) United States Patent
Ito et al.

(10) Patent No.: US 7,794,922 B2
(45) Date of Patent: Sep. 14, 2010

(54) PATTERN FORMING METHOD AND METHOD OF MANUFACTURING SEMICONDUCTOR DEVICE

(75) Inventors: Shinichi Ito, Yokohama (JP); Kentaro Matsunaga, Yokohama (JP); Daisuke Kawamura, Yokohama (JP); Yasunobu Onishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 896 days.

(21) Appl. No.: 11/431,823

(22) Filed: May 11, 2006

(65) Prior Publication Data
US 2006/0263726 A1 Nov. 23, 2006

(30) Foreign Application Priority Data
May 13, 2005 (JP) .............................. 2005-141193

(51) Int. Cl.
*G03F 7/26* (2006.01)
(52) U.S. Cl. .................... 430/327; 430/311; 430/961
(58) Field of Classification Search ................ 430/311, 430/961
See application file for complete search history.

(56) References Cited

U.S. PATENT DOCUMENTS

| | | | |
|---|---|---|---|
| 6,518,199 B2 | 2/2003 | Kitano et al. | |
| 2005/0221234 A1 | 10/2005 | Ito | |
| 2005/0248741 A1 | 11/2005 | Kawamura et al. | |
| 2005/0250054 A1 * | 11/2005 | Chang | 430/329 |
| 2006/0008746 A1 * | 1/2006 | Onishi et al. | 430/322 |
| 2006/0008747 A1 | 1/2006 | Kawamura et al. | |

FOREIGN PATENT DOCUMENTS

| | | |
|---|---|---|
| EP | 1814144 * | 8/2007 |
| JP | 2753930 | 3/1998 |
| JP | 10-335203 | 12/1998 |
| JP | 2001-31986 | 2/2001 |
| JP | 2001-76984 | 3/2001 |
| JP | 2001-319862 | 11/2001 |
| JP | 2005-19969 | 1/2005 |
| JP | 2005-99646 | 4/2005 |
| JP | 2005-109146 | 4/2005 |
| JP | 2006-053300 | 2/2006 |
| JP | 2006-091798 | 4/2006 |
| JP | 2006-146232 | 6/2006 |
| JP | 2006-189611 | 7/2006 |
| WO | WO 2005-019937 | 3/2005 |

OTHER PUBLICATIONS

Notification for Filing Opinion mailed Apr. 2, 2007, in counterpart Korean Application No. 10-2006-0042819.
Ishizuka et al., "New Cover Material Development Status for Immersion Lithography", Web Publication, International Symposium on Immersion and 157nm Lithography, 21 sheets, (2004).
Kawamura et al., "Influence of the Watermark in Immersion Lithography Process", Proceedings of SPIE, vol. 5753, pp. 818-826, (2005).
Petrillo et al., "Progress Towards Developing High Performance Immersion Compatible Materials and Processes", Proceedings of SPIE, vol. 5753, pp. 52-63, (2005).
Shiobara et al., "Resist Pattern Forming Method and Manufacturing Method of Semiconductor Device", U.S. Appl. No. 11/316,898, filed Dec. 27, 2005.
Notice of Reasons for Rejection, mailed May 25, 2010, in corresponding Japanese Patent Application No. 2005-141193, and English-language translation thereof.

* cited by examiner

*Primary Examiner*—Kathleen Duda
(74) *Attorney, Agent, or Firm*—Finnegan, Henderson, Farabow, Garrett & Dunner, L.L.P.

(57) ABSTRACT

A pattern forming method includes forming a photo resist film on a film to be processed, forming a protective film for protecting the photo resist film from an immersion liquid on the photo resist film by coating method, performing immersion exposure selectively to a region of part of the photo resist film via the immersion liquid, the immersion liquid being supplied onto the photo resist film, removing a residual substance including an affinitive part for the immersion liquid from the protective film after the forming the protective film and before the performing immersion exposure selectively to the region of part of the photo resist film, removing the protective film, and forming a pattern comprising the photo resist film by selectively removing an exposed region or a non-exposed region of the photo resist film.

4 Claims, 12 Drawing Sheets

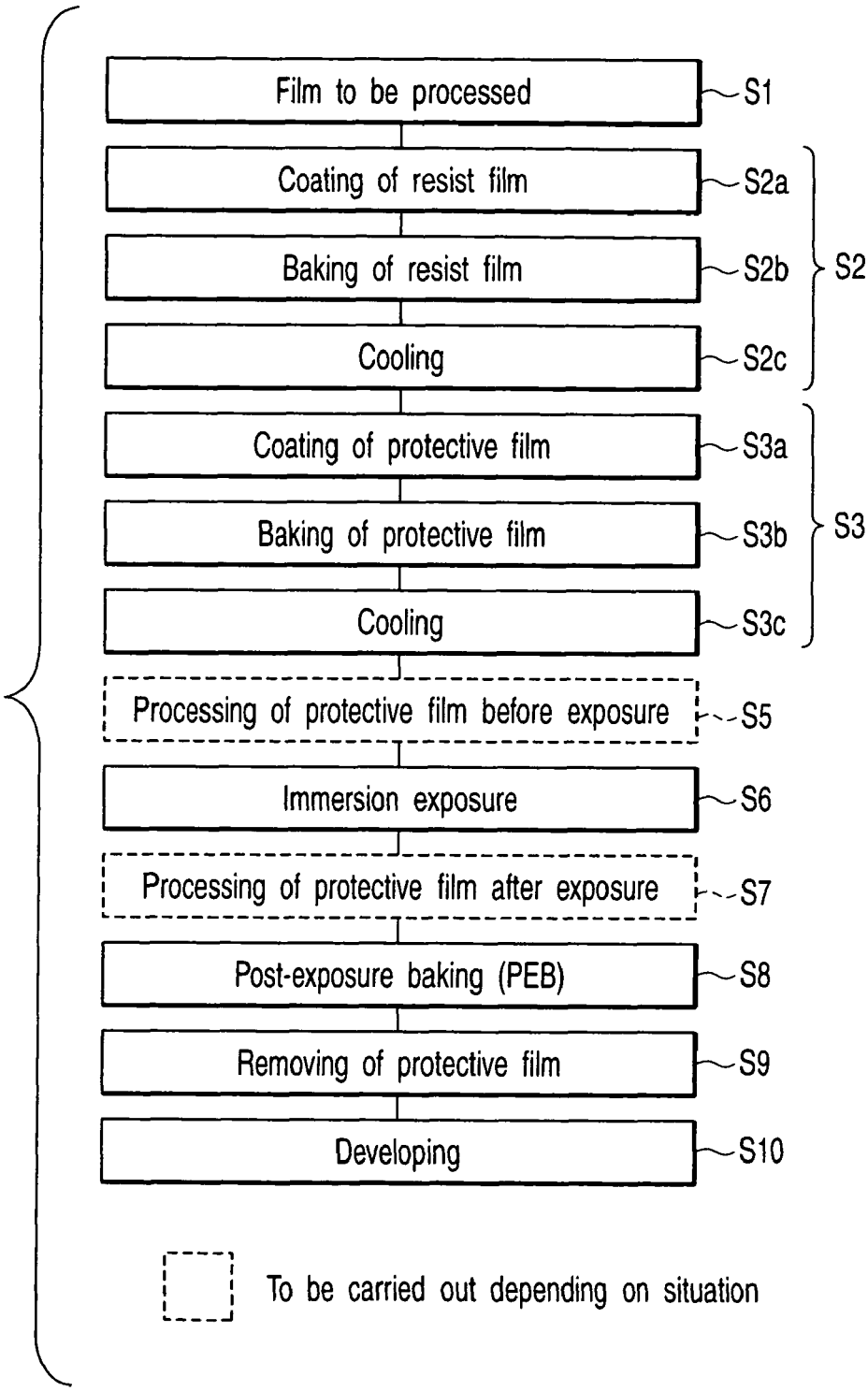

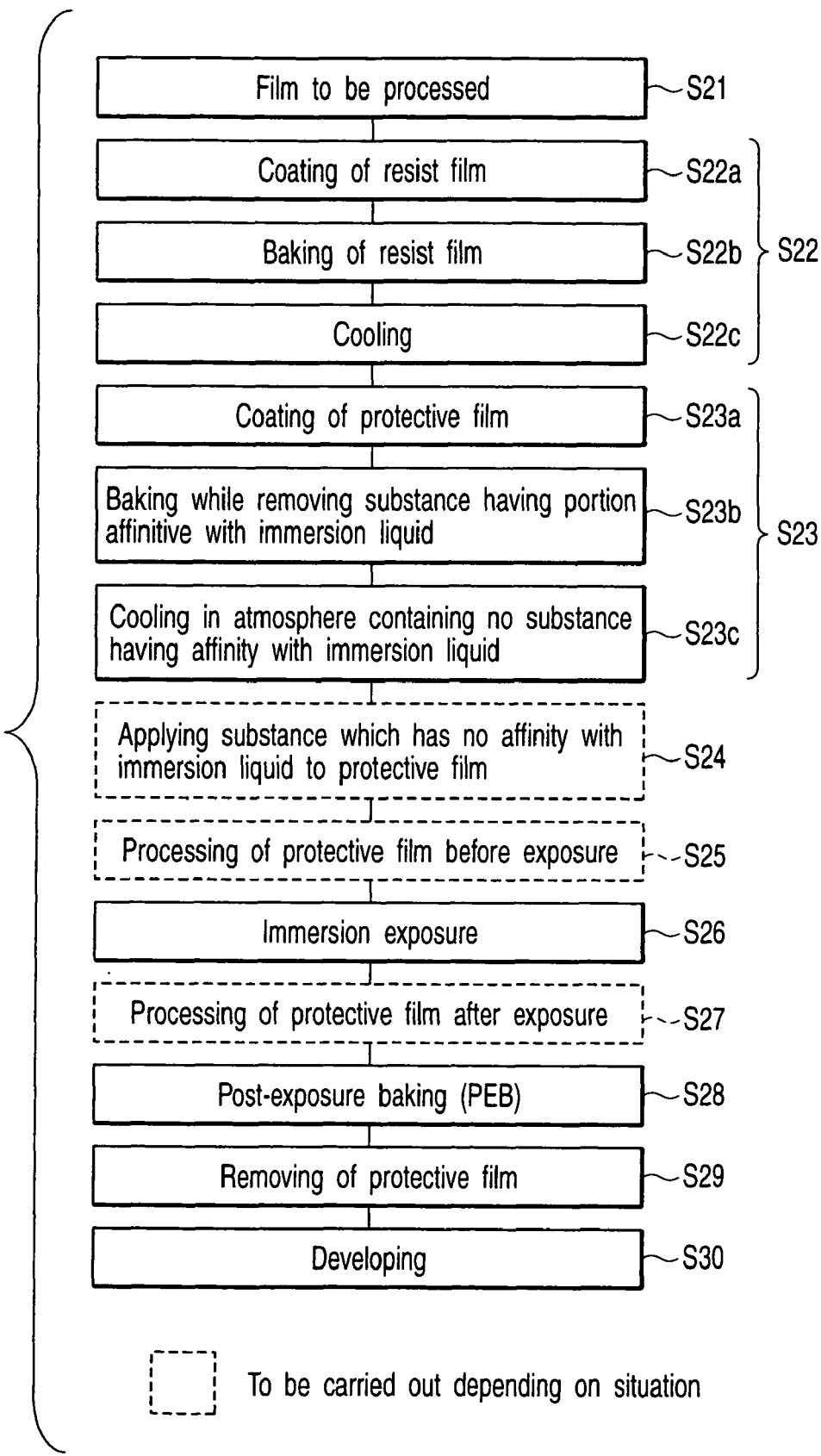

PATTERN FORMING METHOD AND METHOD OF MANUFACTURING SEMICONDUCTOR DEVICE

CROSS-REFERENCE TO RELATED APPLICATIONS

This application is based upon and claims the benefit of priority from prior Japanese Patent Application No. 2005-141193, filed May 13, 2005, the entire contents of which are incorporated herein by reference.

BACKGROUND OF THE INVENTION

1. Field of the Invention

The present invention relates to a pattern forming method in the field of semiconductor and a method of manufacturing a semiconductor device.

2. Description of the Related Art

In recent years, with a downsized element and a highly integrated LSI, there has been a request for resolution equal to or smaller than a wavelength an ultraviolet ray. For this reason, exposure process latitudes such as exposure latitude and focus latitude have been insufficient.

Thus, a liquid immersion exposure technique has been proposed as a technique of improving a resolution by using a conventional exposure light source. The liquid immersion exposure technique, as disclosed in Japanese Patent No. 2753930, is provided as a technique for separating an optical element opposed to a surface of substrate of a projection optical system from a projection optical system main body and using the optical element as a flat shaped element having two surfaces parallel to each other; providing means comprising a container that configures a closed space for filling a liquid between the flat shaped element and the substrate opposed thereto; and carrying out exposure while relatively moving the means and an exposure region on the substrate.

In the liquid immersion exposure technique, there has been studied that a protective film is formed on a resist film in order to prevent entry of an immersion liquid into the resist film or elusion from the resist film into the immersion liquid.

A typical example of a protective film to be formed on a resist film before exposure is, for example, a film which is formed by applying fluorine-based process gas on a surface of a resist film as disclosed in Jpn. Pat. Appln. KOKAI Publication No. 2001-319862.

In contrast, as disclosed in Keita Ishizuka et al., New Cover material Development Status for Immersion Lithography, Web publication of International symposium on immersion and 157 nm lithography, a protective film used in immersion exposure is a film formed as a coating film on a resist film, apart from the resist film.

However, the protective film formed by the method of this type cannot achieve the purpose described previously. For example, Daisuke Kawamura et al., Influence of the watermark in immersion lithography process (SPIE2005) discloses that, as shown in FIG. 1, depending on the shape of an immersion liquid 93 that remains on a protective film 92, the immersion liquid as the droplet 93 penetrates the protective film 92 and reaches a resist film, and a water stain (watermark) 94 occurs on an interface between the protective film 92 and the resist film 91. The immersion liquid 93 shown in FIG. 1 shows a water droplet having a diameter of 0.1 mm.

A behavior of a photosensitizing agent or the like eluting from a film into an immersion liquid is studied with respect to the resist film as well. For example, in Karen Petrillo et al., (SPIE2005 5753-9), there is disclosed that, even in the case of forming a resist film including the same solid component, an eluted amount of a photosensitive substance differs depending on the type of a solvent included in a photosensitizing agent solution, as shown in Table 1 (refer to FIG. 2 for a molecular structure of the solvent). In an example of Table 1, the eluted amount increases in the case where ethyl lactate having alcoholic property OH is included.

TABLE 1

| Solvent system | Contact angle (°) | Eluted amount (ppb) |
| --- | --- | --- |
| PGMEA + EL + GBL | 68.5 | 73 |
| PGMEA + EL | 67 | 55 |
| PGMEA + GBL | 65 | 25 |
| PGMEA + Cycrohexanon | 65 | 25 |

The elusion of a photosensitizing agent or a dissolution inhibitor agent from a resist film into an immersion liquid degrades a resist performance. In addition, an optical system of an exposure apparatus is contaminated with the eluted liquid. The contamination of the optical system degrades an image forming property.

A resist film or a protective film is formed by a rotating coating method. In this technique, baking is carried out after forming a coat film in order to remove a solvent.

The baking is carried out in a humidity-controlled atmosphere. The baking may be carried out in an atmosphere containing a dry air, oxygen, or nitrogen, etc., as disclosed in Jpn. Pat. Appln. KOKAI Publication No. 10-335203. Jpn. Pat. Appln. KOKAI Publication No. 10-335203 discloses selecting a gas which is preferable to an atmosphere at the time of baking and a device for supplying the gas. There is also disclosed that atmosphere switching means can be applied to a cool plate or a device for continuously carrying out a plurality of substrate processings.

After the baking, the substrate is cooled. For example, Jpn. Pat. Appln. KOKAI Publication No. 2001-76984 discloses a technique for substituting a current atmosphere with an inert gas or a purified air atmosphere after carrying out a substrate heating process, and then, cooling the substrate, in order to reduce a cooling time and to make uniform in-plane temperature distributions of a substrate to be processed.

Further, Jpn. Pat. Appln. KOKAI Publication No. 2005-19969 discloses a technique for, with respect to a resist pattern after developed, applying a solvent steam which dissolves the developed resist pattern, thereby smoothening a surface of the resist pattern.

BRIEF SUMMARY OF THE INVENTION

According to an aspect of the present invention, there is provided a pattern forming method comprising forming a photo resist film on a film to be processed; forming a protective film for protecting the photo resist film from an immersion liquid on the photo resist film by coating method; performing immersion exposure selectively to a region of part of the photo resist film via the immersion liquid, the immersion liquid being supplied onto the photo resist film; removing a residual substance including an affinitive part for the immersion liquid from the protective film after the forming the protective film and before the performing immersion exposure selectively to the region of part of the photo resist film; removing the protective film; and forming a pattern comprising the photo resist film by selectively removing an exposed region or a non-exposed region of the photo resist film.

According to another aspect of the present invention, there is provided a pattern forming method comprising forming a photo resist film on a film to be processed; performing immersion exposure selectively to a region of part of the photo resist film via an immersion liquid, the immersion liquid being supplied onto the photo resist film; removing a residual substance including an affinitive part for the immersion liquid from the photo resist film after the forming the protective film and before the performing immersion exposure-selectively to the region of part of the photo resist film; and forming a pattern comprising the photo resist film by selectively removing an exposed region or a non-exposed region of the photo resist film.

According to another aspect of the present invention, there is provided a pattern forming method comprising forming a photo resist film on a film to be processed; forming a protective film for protecting the photo resist film from an immersion liquid on the photo resist film by coating method; performing immersion exposure selectively to a region of part of the photo resist film via the immersion liquid, the immersion liquid being supplied onto the photo resist film; smoothening a surface of the protective film after the forming the protective film and before the performing immersion exposure selectively to the region of part of the photo resist film; removing the protective film; and forming a pattern comprising the photo resist film by selectively removing an exposed region or a non-exposed region of the photo resist film.

According to another aspect of the present invention, there is provided a pattern forming method comprising forming a photo resist film on a film to be processed; performing immersion exposure selectively to a region of part of the photo resist film via an immersion liquid, the immersion liquid being supplied onto the photo resist film; smoothening a surface of the photo resist film after the forming the photo resist film and before the performing immersion exposure selectively to the region of part of the photo resist film; forming a pattern comprising the photo resist film by selectively removing an exposed region or a non-exposed region of the photo resist film.

According to another aspect of the present invention, there is provided a pattern forming method comprising forming a photo resist film on a film to be processed; forming a protective film for protecting the photo resist film from an immersion liquid on the photo resist film by coating method; performing immersion exposure selectively to a region of part of the photo resist film via the immersion liquid, the immersion liquid being supplied onto the photo resist film; removing the protective film by using a first developing solution having an alkali concentration at which a dissolution rate of the protective film is faster than that of the photo resist film; and forming a pattern comprising the photo resist film by selectively removing an exposed region or a non-exposed region of the photo resist film using a second developing solution whose an alkali concentration is higher than that of the first developing solution.

According to an aspect of the present invention, there is provided a method of manufacturing a semiconductor device comprising forming a resist pattern on a substrate including a semiconductor substrate, the resist pattern being formed by pattern forming method according to an aspect of the present invention; and forming a pattern by etching the substrate using the resist pattern as a mask.

BRIEF DESCRIPTION OF THE SEVERAL VIEWS OF THE DRAWING

FIG. 4 is a process flow showing a conventional method of forming a resist pattern;
FIG. 7 is a process flow showing a method of forming a resist pattern of a third embodiment according to the present invention.

DETAILED DESCRIPTION OF THE INVENTION

Figure 1:
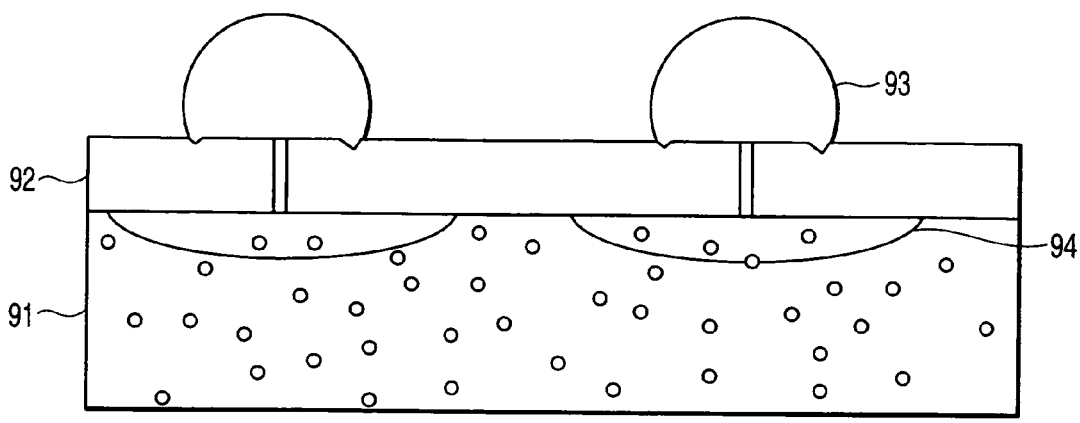
FIG. 1 is a drawing for explaining a problem of prior art.
Figure 2:
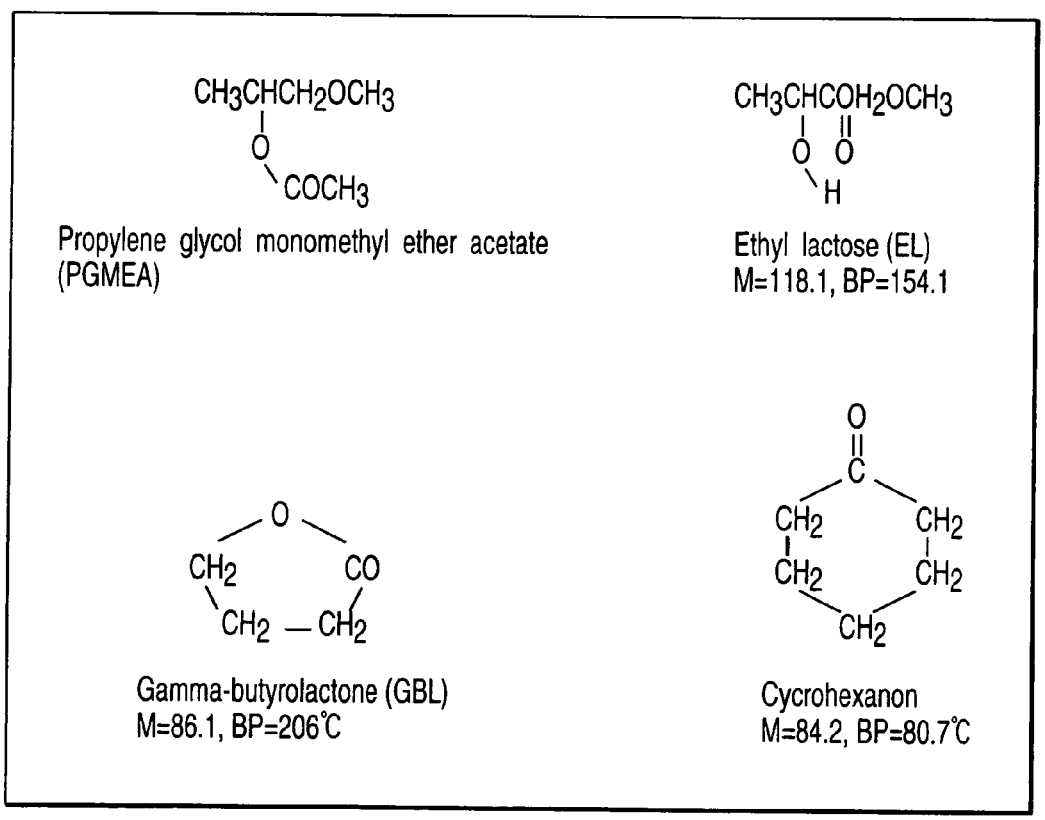
FIG. 2 shows a molecular structure of a solvent.

Now, embodiments of the present invention will be described below with reference to the accompanying drawings.

First Embodiment

Brief descriptions of a pattern forming method and a method of manufacturing a semiconductor device in an embodiment according to the present invention will be given below.

(1) A pattern forming method includes:
a first film forming step of forming a photo resist film (first film) containing a first film material on a film to be processed;
a second film forming step of coating a solution containing a second film material on the photo resist film (by coating method), thereby forming a second film (protective film to protect the photo resist film);
an immersion exposure step of performing immersion exposure to the photo resist film with the second film formed thereon selectively via an immersion liquid;
a step of removing the second film; and
a developing step of removing an exposed region or a non-exposed region of the photo resist film selectively, the method further including:

a step of removing a residual substance including an affinitive part for the immersion liquid used in the immersion exposure step from the second film, prior to the immersion exposure step from the second film forming step.

In the present embodiment and following other embodiments, photo resist film includes photosensitive resin film or film that includes resin and photo acid generator.

(2) In the (1) above, the step of removing the residual substance is a step of baking the second film which is carried out after applying a first solvent whose boiling point is lower than that of a second solvent which is remained on the second film, or a step of baking the second film, which is carried during applying the first solvent whose boiling point is lower than that of the second solvent.

(3) In the (2), the first solvent is made by adding a solvent whose boiling point is lower than that of the second solvent into an atmosphere which is has no affinity with the immersion liquid.

(4) In the (2), the baking step is carried out at a higher temperature than the boiling point of the first solvent.

(5) In the (2), a surface of the second film is exposed in the atmosphere after baking the second film material, thereafter, the second film is cooled.

(6) In the (1), the step of removing a residual substance is a process for increasing a receding contact angle relevant to an immersion liquid of the second film, as compared with the step prior to the step of removing the residual substance.

(7) In the (3) or (5), the atmosphere is any one of a dry air, dry nitrogen, and dry helium.

(8) In any one of the (1) to (4), a light beam used in the immersion exposure step is an ArF laser light beam (wavelength 193 nm) or a KrF laser light beam (wavelength 248 nm), the immersion liquid is water, and the first solvent and the second solvent have an alcoholic OH group.

(9) In the (7), the first solvent is 1-butanol or an alcohol having 5 or more carbons.

(10) In the (7), the second solvent is methanol, ethanol, or 2-propanol.

(11) In the (1), a light beam used in the immersion exposure step is an ArF laser light beam (wavelength 193 nm), a KrF laser light beam (wavelength 248 nm) or a fluorine laser light beam (wavelength 157 nm), and the immersion liquid is an organic substance.

(12) A pattern forming method includes:

a film forming step of a photo resist film by coating a solvent containing a photo resist film material on a film to be processed (by coating method);

an immersion exposure step of selectively performing immersion exposing to the photo resist film via an immersion liquid; and a developing step of selectively removing an exposed region or a non-exposed region of the photo resist film, the method further including:

a step of removing a residual solvent having a portion that is affinitive with an immersion liquid used in the immersion exposure step from the photo resist film, after the first film forming step and before the immersion exposure step.

(13) In the (12), the step of removing the residual solvent is a step of baking which is carried out after applying a second solvent whose boiling point is lower than that of the first solvent that remains on the photo resist film, or a step of baking which is carried out while the second solvent whose boiling point is lower than that of the first solvent is applying to the photo resist film.

(14) In the (13), the second solvent is made by adding the second solvent into an atmosphere which has no affinity with the immersion liquid.

(15) In the (13), the baking step is carried out at a temperature higher than the boiling point of the second solvent.

(16) In the (13), a surface of the second film is exposed in the atmosphere after baking the second film material, thereafter, the second film is cooled.

(17) In the (12), the step of removing a residual substance is a process for increasing a receding contact angle relevant to an immersion liquid of the second film, as compared with the step prior to the step of removing the residual substance.

(18) In the (14) or (16), the atmosphere is any one of a dry air, dry nitrogen, and dry helium.

(19) In any one of the (12) to (15), a light beam used in the immersion exposure step is an ArF laser light beam (wavelength 193 nm) or a KrF laser light beam (wavelength 248 nm), the immersion liquid is water, and the first solvent and the second solvent have an alcoholic OH group.

(20) In the (18), the first solvent is 1-butanol, ethyl lactate, or an alcohol having 5 or more carbons.

(21) In the (18), the second solvent is methanol, ethanol, or 2-propanol.

(22) In the (12), a light beam used in the immersion exposure step is an ArF laser light beam (wavelength 193 nm), a KrF laser light beam (wavelength nm) or a fluorine laser light beam (wavelength 157 nm), and the immersion liquid is an organic substance.

(23) A pattern forming method includes:

a first film forming step of forming a photo resist film (first film) on a film to be processed;

a second film forming step of forming a second film (protective film to protect the photo resist film) by coating a second film material on the photo resist film (by coating method);

an immersion exposure step of performing immersion exposure to the photo resist film selectively via an immersion liquid in a state that the second film is formed;

a step of removing the second film; and a developing step of selectively removing an exposed region or a non-exposed region of the photo resist film, the method further including:

a step of smoothening a surface of the second film after the second film forming step and before the immersion exposure step.

(24) In the (23), the smoothening step is carried out by exposing the second film in an atmosphere containing a solvent which dissolves the second film.

(25) In the (23), the smoothening step is carried out while heating the second film.

(26) In the (24), the solvent in which the second film dissolves is a solvent material contained in the second film material.

(27) In the (25),

The solvent in which the second film dissolves is acetone, propylene glycol monomethyl ether acetate, N-methyl 2-pyrrolidinone, or alcohol.

(28) In the (29),
the atmosphere is mainly made of a dry air, dry nitrogen, or dry helium.

(29) In the (23),
a light beam used in the immersion exposure step is an ArF laser light beam (wavelength 193 nm), a KrF laser light beam (wavelength 248 nm), or an $F_2$ laser light beam (wavelength 157 nm).

(30) A pattern forming method includes:
a film forming step of forming a photo resist film on a film to be processed;
an immersion exposure step of performing immersion exposure to the photo resist film selectively via an immersion liquid;
a developing step of selectively removing an exposed region or a non-exposed region of the photo resist film, the method further including:
a step of smoothing a surface of the photo resist film after the film forming step and before the immersion exposure.

(31) In the (30),
the smoothening step is carried out by exposing a surface of the photo resist film in an atmosphere containing a solvent which dissolves the photo resist film.

(32) In the (30),
the smoothening step is carried out while heating the photo resist film.

(33) In the (30),
the solvent in which the photo resist film dissolves is a solvent material contained in the photo resist film.

(34) In the (30),
the solvent in which the photo resist film dissolves is acetone, propylene glycol monomethyl ether acetate, N-methyl 2-pyrrolidinone, or alcohol.

(35) In the (30),
the atmosphere is mainly made of a dry air, dry nitrogen, or dry helium.

(36) In the (30),
a light beam for use in the immersion exposure step is an ArF laser light beam (wavelength 193 nm), a KrF laser light beam (wavelength 248 nm), or an $F_2$ laser light beam (wavelength 157 nm).

(37) A pattern forming method includes:
a first film forming step of forming a photo resist film (first film) on a film to be processed;
a second film forming step of forming a second film (protective film to protect the photo resist film) by coating a second film material on the photo resist film (by coating method);
an immersion exposure step of performing immersion exposure to the photo resist film selectively via an immersion liquid in a state that the second film is formed;
a step of removing the second film; and
a developing step of selectively removing an exposed region or a non-exposed region of the photo resist film,
wherein the second film is a film soluble in a developer used in the developing step, and
the developing step includes: a first developing step of selectively carrying out dissolution of the second film by using a first developer having a concentration at which a dissolution rate of the second film is faster than that of the photo resist film; and a second developing step of carrying out development of the photo resist film by using a developer whose concentration is higher than that of the first developer.

(38) In the (37),
further including: a step of removing a dissolved substance of the second film eluted in the first developing step between the first developing step and the second developing step.

(39) A method of manufacturing a semiconductor device, includes:
a step of forming a resist pattern on a substrate including a semiconductor substrate by the pattern forming method of any one of the (1) to (37); and
a step of forming a pattern by etching the substrate using the resist pattern as a mask.

Now, the pattern forming method and the method of manufacturing a semiconductor device will be described below in detail by way of second to sixth embodiments.

Second Embodiment

Figure 3:
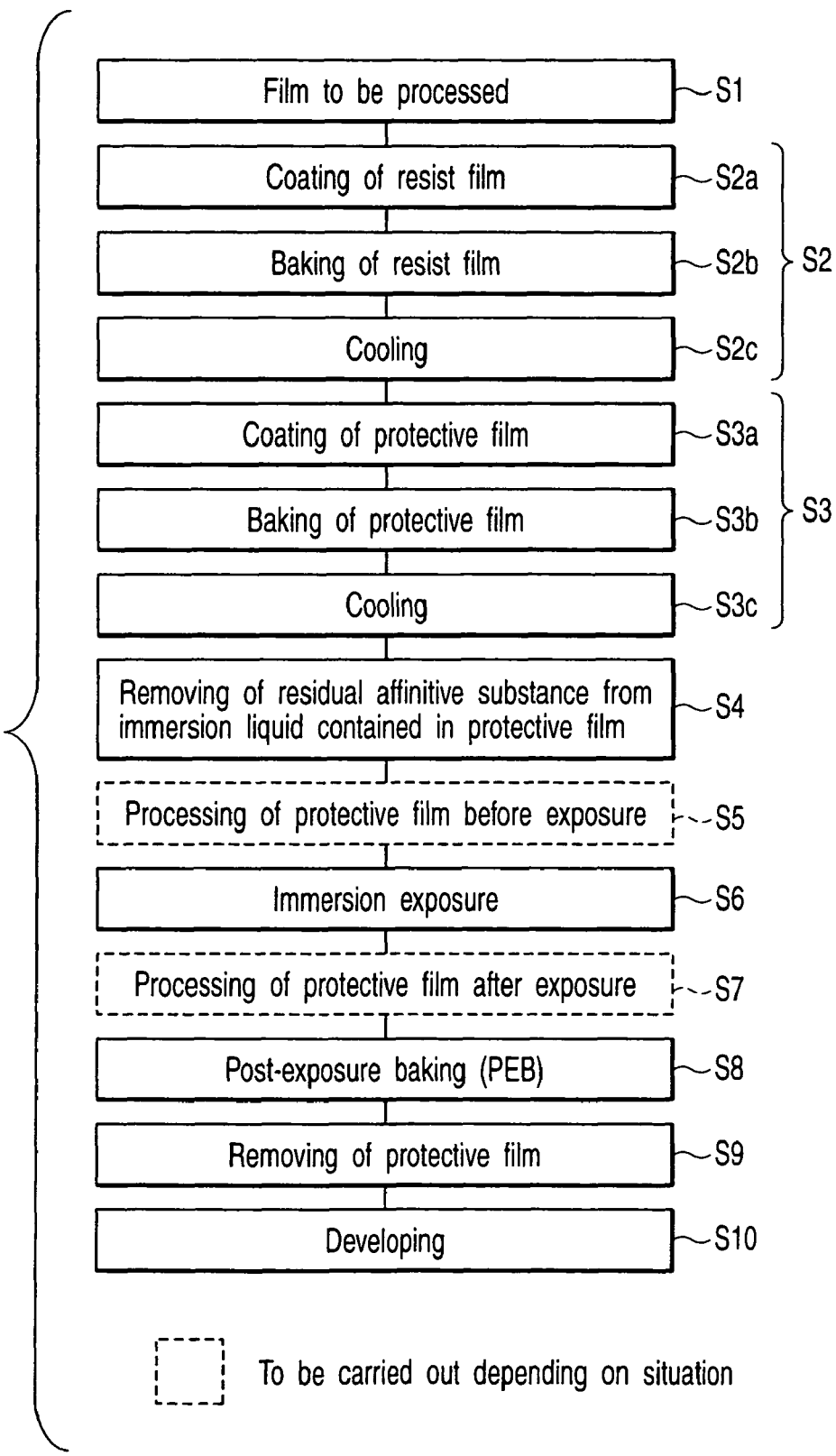
FIG. 3 is a process flow showing a method of forming a resist pattern of a second embodiment according to the present invention.

FIG. 3 is a process flow showing a method of forming a resist pattern in a second embodiment according to the present invention. The present embodiment describes a method of forming a resist pattern when an ArF excimer laser (wavelength 193 nm) is used as a light source and when pure water is used as an immersion liquid. For the sake of comparison, a process flow of a conventional method of forming a resist pattern is shown in FIG. 4.

First, a film to be processed is prepared (step S1). The film includes an oxide film (first film to be processed) and an antireflection film (second film to be processed) formed on the oxide film. The film to be processed (oxide film, antireflection film) is formed on a semiconductor substrate (wafer).

The step of forming the antireflection film includes a step of forming a film having an antireflection effect with respect to an exposure light beam (wavelength 193 nm) on the oxide film by spin coating method; and a step of baking the film.

Next, a photo resist film (first film) is formed on the film to be processed (step S2). The step of forming the photo resist film (step S2) includes a step (coating of photo resist film step (step S2a)) of coating a photo resist material having photosensitivity with respect to an exposure light beam (wavelength 193 nm) on a film (antireflection film) obtained by cooling the baked film to be adjusted at a desired temperature; a step (baking of photo resist film step (step S2b)) of baking for curing the photo resist film at 110° C.; and a step (step S2c) of cooling the cured photo resist film (heated resist film) by the baking.

The coating of photo resist film step (step S2a) includes a step of dropping a photo resist solution on the film to be processed on the main surface of the semiconductor substrate; and a step of approximately removing a solvent of the photo resist solution while rotating the semiconductor substrate.

Next, a protective film (second film) for preventing an immersion liquid from being absorbed into the photo resist film or a substance contained in the photo resist film from being eluted in the immersion liquid is formed on the photo resist film (first film) (step S3).

The step of forming a protective film (step S3) includes a step (step of coating protective film (step S3a)) of coating a solution (protective film solution) containing a material for the protective film on the resist film; a step (step of baking protective film (step S3b)) of baking for curing the protective film solution; and a step (step S3c) of cooling the cured protective solution film (heated protective film) by the baking.

1-hexanol (having affinitive group of alcoholic OH relevant to an immersion liquid (water) and boiling point of 158° C.) is contained in a solvent of the protective film solution. It was verified that a very small amount of 1-hexanol remained even in the protective film after baked (step S3c).

The above steps (steps S1 to S3) are identical in comparison between the embodiment and a prior art. After step S3, in the case where the substrate including the protective film and the film to be processed was exposed to the immersion liquid (water) immediately, and then, immersion exposure was carried out, several hundreds of watermarks per wafer were detected on the photo resist film.

A reason why the watermarks have occurred will be described with reference to FIGS. 5A and 5B.

Figure 5A:
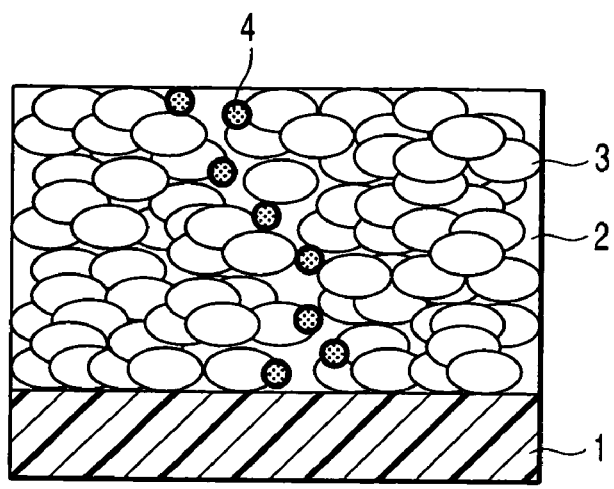
FIGS. 5A and 5B are drawings for explaining a reason why a watermark occurs in the prior art.
Figure 5B:
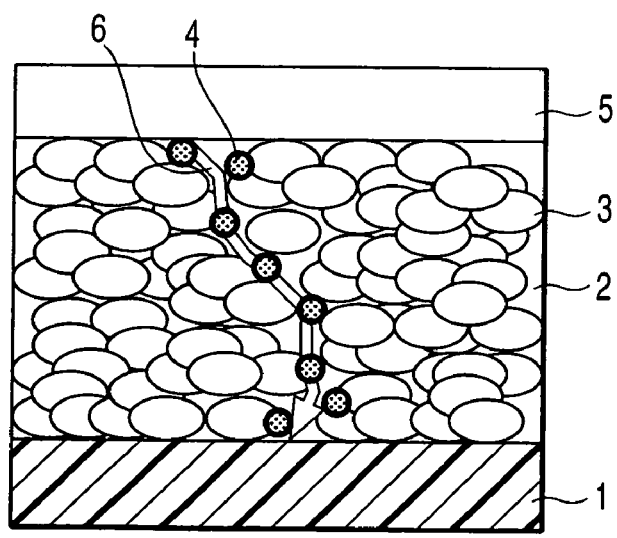

In FIGS. 5A and 5B, reference numeral 1 denotes a photo resist film; 2 denotes a protective film; 3 denotes a polymer (aggregate) contained in a protective film; 4 denotes a remained solvent having affinity with an immersion liquid; 5 denotes an immersion liquid; 6 denotes a passage through which an immersion liquid is guided. FIG. 5A shows an internal state of the protective film 2 after heating (step S3b), and FIG. 5B shows an internal state of the protective film after immersion exposure (step S6).

In the protective film 2, there exist a number of exits of the solvent that has occurred at the time of substrate rotation and baking. These exits are trajectories produced when a certain degree of solvent aggregates and evaporates from the film, and thus, a very small amount of solvent 4 exists in the vicinity of the exits. In the case where the solvent 4 has affinity with the immersion liquid 5, it is considered that the immersion liquid 5 is introduced into the protective film 2 at the time of immersion exposure, and, for example, the immersion liquid 5 arrives at the surface of the resist film 1 by way of the passage 6.

Therefore, in the present embodiment, after forming a protective film and before immersion exposure, a solvent (residual affinitive substance) is removed from the immersion liquid contained in the protective film (step S4).

Figure 6A:
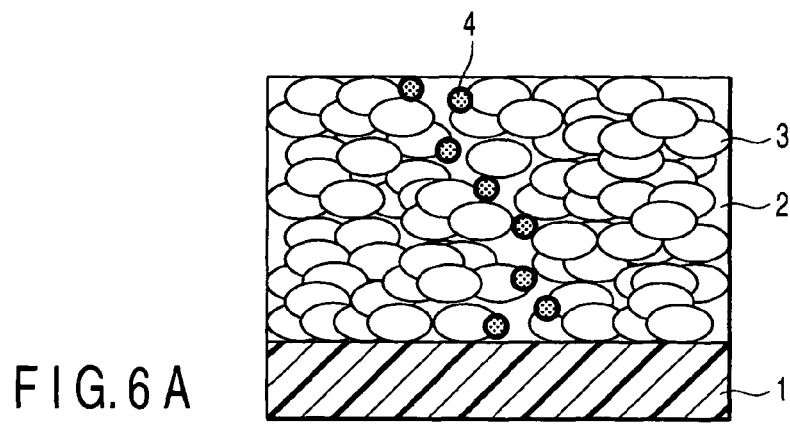
FIGS. 6A to 6C are drawings for explaining a reason why an occurrence of a watermark can be prevented in the embodiment.
Figure 6B:
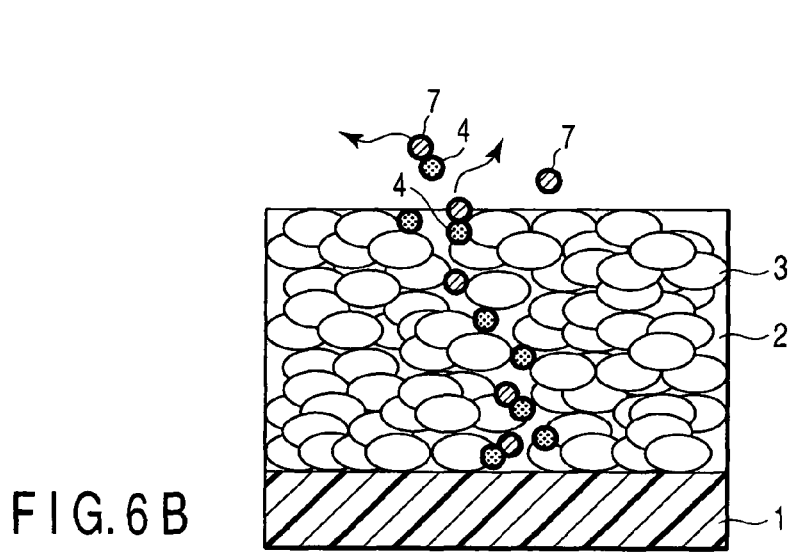
Figure 6C:

A reason why an occurrence of a watermark can be prevented will be described with reference to FIGS. 6A to 6C. FIG. 6A shows an internal state of the protective film 2 after heating (step S3b), FIG. 6B shows an internal state of the protective film 2 after removing the residual affinitive substance (step S4), and FIG. 6C shows an internal state of the protective film at the time of immersion exposure (step S6).

In the present embodiment, the protective film 2 is formed, and then, an isopropyl alcohol having affinity with the solvent 4 and having a lower boiling point than the solvent 4 is applied to the solvent 7 in order to remove the solvent 4 (alcohol) that remains in the vicinity of the exit of the solvent, thereby, the solvent 4 is evaporated together with the isopropyl alcohol.

That is, the isopropyl alcohol is bulled with dry nitrogen, thereby producing a dry nitrogen atmosphere which contains the isopropyl alcohol, and then, supplying this atmosphere to the surface of the protective film 2. Since a boiling point of the isopropyl alcohol is 82.4° C., an environment has been established such that a substance applied to the protective film 2 by heating 95° C. easily evaporates. In accordance with this process, the solvent 4 that remains in the protective film 2 is removed. As a result, affinity of the exit (passage 6) of the solvent with the immersion liquid 5 is greatly lowered.

Prior to the step (step S4) of removing the substance having affinity with the immersion liquid from the protective film, a receding contact angle relevant to the surface of the protective film was measured as 65° by expansion and contraction technique.

On the other hand, a receding contact angle of the protective film having removed therefrom the substance having affinity after step S4 was 80°, and it was verified that the receding contact angle significantly increased.

When exposure was carried out while a liquid film was maintained in a local region including an exposed region at the time of immersion exposure, the residual liquid droplets occurred on the substrate in an exposure operation at the time of immersion exposure in the case where the receding contact angle was 65°. In the case of the receding contact angle after step S4 was 80°, the residual liquid droplets were not observed. Although the residual liquid droplets can cause a watermark defect, the risk was greatly reduced by this process (step S4).

When the residual liquid droplets were evaluated with respect to a variety of films, the residual liquid droplets were not observed when the receding contact angle was equal to or greater than 75°. From this fact, it is preferable to control a concentration of isopropyl alcohol contained in an atmosphere, a flow rate of the atmosphere, a pressure, a substrate temperature, and a processing time such that the receding contact angle is equal to or greater than 75°.

In addition, apart from the isopropyl alcohol, the receding contact angle was successfully set to equal to or greater than 75° by means of treatment with methanol (boiling point of 64.7° C. and proper baking temperature of 65° C. or higher) and ethanol (boiling point of 78.3° C. and proper baking temperature of 80° C. or higher).

Immersion exposure is carried out by using a substrate having the thus processed protective film (step S6), and then, a resist pattern is formed through well known steps, namely, a post-exposure baking (PEB) step (step S7), a protective film removing step (step S8), and a photo resist film developing step (step S9).

When the thus formed resist pattern in the present embodiment was inspected, it was verified that the number of watermarks having occurred in a conventional process was reduced to several watermarks per wafer.

When, with the resist pattern of the present embodiment using as a mask, a trench pattern formed by sequentially etching the antireflection film (second film to be processed) and the oxide film (first film to be processed) was inspected, the number of defects was merely produced as several defects per wafer, and a good result was obtained. A device produced by filling the inside of the trench pattern with a wiring material, and by further performing a post-processing showed good reliability.

The present embodiment relates to a 1-hexanol solvent contained in a protective film solvent, however it is not limited thereto. The target solvent includes a substance having an alcoholic OH group whose boiling point under normal pressure is approximately 100° C. or higher.

For example, substances having one alcohol OH group showed an effect of removing the residual substance from the inside of the protective film in the case where they have 4 carbons and having a OH group at position 1 such as 1-butanol, 1-pentanol, 2-pentanol, 3-pentanol, 2-hexanol, 3-hexanol, 1-heptanol, 2-heptanol, 3-heptanol, 4-heptanol, 1-octanol, 1-octanoil, 2-octanol, 2-octanbol, 3-octanol and 4-octanol and in the case where they have OH at the other position and having 5 carbons.

Further, an effect of removing the residual substance was verified in an alcohol having an ester structure (for example, ethyl lactate: boiling point of 154° C.).

Also in substances having two or more alcoholic OH groups, a removing effect was observed although it was less significant than these alcohols.

In the present embodiment, an isopropyl alcohol was used in order to remove the affinitive substance with the immersion liquid caused by a solvent contained in the protective film, however it is not limited thereto. The target substances are those having an alcoholic OH group whose boiling point under normal pressure is approximately less than 100° C. Dehydrated and amine-removed methanol and ethanol may be supplied to the surface of the protective film after they are contained in a dry air, dry helium, or dry nitrogen.

A reason why a dehydrating process and an amine-removing process are carried out for an atmosphere and substances contained in the atmosphere is that, if exposure is carried out while these substances are contained, these substances are prevent from being reversibly adsorbed by the exit of the solvent, and these substances are prevented from being inductive substances of the immersion liquid and from being sources of producing watermarks.

From the heating using an isopropyl alcohol to the ending of film cooling, it is preferable that an atmosphere in which the surface of the protective film is exposed is controlled so as not to contain a substance having affinity with an immersion liquid (substance chemically and physically adsorbed with moisture or alcohol and amine or water in the case where the immersion liquid is water or analogous organic substance in the case where the immersion liquid is an organic substance).

Desirably, exposure may be carried out in an atmosphere containing a dry air, dry helium, or dry nitrogen. More desirably, chemical reaction or physical adsorption may be carried out at the time of exposure to an atmosphere having no affinity with an immersion liquid (atmosphere containing a fluorine-based substance in the case where the immersion liquid is water and silazane compounds (hexamethyl silazane or tetramethyl silazane, etc.) or an atmosphere containing alcohol in the case where the immersion liquid is an organic substance).

In the case where affinity with an immersion liquid is caused by carrying out chemical reaction, affinitive substances may be removed again by applying the alcohol having a low boiling point as shown in the present embodiment after the processing or may be removed after the chemical reaction is carried out.

In the case where the surface of the protective film before immersion exposure is contaminated with fine particles, the surface of the protective film may be washed prior to immersion exposure (processing of protective film before exposure (step S5)).

In addition, in the case where exposure is carried out while a liquid film is maintained in a local region including an exposed region at the time of immersion exposure, a reforming process may be carried out with respect to the surface of the protective film so as not to cause the liquid film to splash out of the local region (processing of protective film before exposure (step S5)).

In the case where a liquid droplet has occurred on the protective film at the time of immersion exposure, such a liquid droplet may be removed immediately prior to carrying out post-exposure balking (step S8) in order to prevent an occurrence of a watermark or a pattern dimension/shape failure (processing of protective film after exposure (step S7)).

The present embodiment describes a case of using an exposure light beam having a wavelength 193 nm. Even in the case of using an exposure light beam having a wavelength 248 nm and even in the case of using water or an organic substance for an immersion liquid, an effect capable of reducing a watermark defect in accordance with a similar process was verified.

Further, even when an exposure light beam having a wavelength 157 nm was used and a fluorine-based organic substance was used for an immersion liquid, an effect capable of reducing a watermark defect by a similar process was verified.

The baking temperatures for the photo resist film and protective film are not limited to the values according to the present embodiment, and may be temperatures capable of attaining protecting characteristics depending on materials. It is desirable that the baking temperature for the protective film is lower than that for the photo resist film so as not to cause a substance in the photo resist film to move into the protective film.

The underlying layer processing step according to the present embodiment relates to the step of forming a trench on the oxide film, however it is not limited thereto. For example, this step can be applied to lithography step for all the device manufacturing steps such as contact hole formation, gate formation, active area formation, and ion implantation.

Third Embodiment

FIG. 7 is a process flow showing a method of forming a resist pattern in a third embodiment according to the present invention.

First, a film to be processed is prepared (step S21). The film to be processed includes an oxide film (first film to be processed) and an antireflection film (second film to be processed) formed on the oxide film. The film to be processed (oxide film, antireflection film) is formed on a semiconductor substrate (wafer).

The step of forming the antireflection film includes a step of forming a film having an antireflection effect with respect to an exposure light beam (wavelength 193 nm) on the oxide film by spin coating method; and a step of baking the film.

Next, a photo resist film (first film) is formed on the film to be processed (step S22). The step of forming the photo resist film (step S22) includes a step (coating of photo resist film step (step S22*a*)) of coating a photo resist material having photosensitivity with respect to an exposure light beam (wavelength 193 nm) on a film (antireflection film) obtained by cooling the baked film to be adjusted at a desired temperature; a step (baking of photo resist film step (step S22*b*)) of baking for curing the photo resist film; and a step (step S22*c*) of cooling the cured photo resist film (heated resist film) by the baking.

The coating of photo resist film step (step S22*a*) includes a step of dropping a photo resist solution on the film to be processed on the main surface of the semiconductor substrate; and a step of approximately removing a solvent of the photo resist solution while rotating the semiconductor substrate.

Next, a protective film (second film) for preventing an immersion liquid from being absorbed into the photo resist film or a substance contained in the resist film from being eluted in the immersion liquid is formed on the photo resist film (first film)(step S23)

The step of forming a protective film (step S23) includes a step (step of coating protective film (step S23*a*)) of coating a solution (protective film solution) containing a material for the protective film on the photo resist film; a step (step of baking protective film (step S23*b*)) of baking for curing the protective film solution; and a step (step S23*c*) of cooling the cured protective solution film (heated protective film) by the baking.

2-hexanol is included in a solvent of the protective film solution. A very small amount of 2-hexanol was observed on a protective film prepared by baking it in an atmosphere having humidity of 40%.

Therefore, in the present embodiment, the step of forming a protective film (step S23) was carried out as follows.

The step of coating protective film (step S23*a*) includes a step of dropping the protective film solution on the photo resist film on the main surface of the semiconductor substrate; and a step of appropriately removing a solvent of the protective film solution while rotating the semiconductor substrate.

The step of baking protective film (step S23b) is the step of baking the protective film while removing a substance having a portion that is affinitive with an immersion liquid from the protective film, and includes a step of introducing an atmosphere that contains ethanol anhydride having a lower boiling point than 2-hexanol in a dry air into a bake chamber; and a step of heating the substrate in the atmosphere at 110° C.

By heating the substrate in the atmosphere, 2-hexanol that remains in the protective film after rotational coating (having alcoholic OH at a portion that is weakly affinitive with an immersion liquid) was applied to the ethanol anhydride while in baking process so as to be easily discharged from the film. When the protective film subjected to the baking process in this atmosphere was inspected, it was verified that an alcohol caused by the solvent could be approximately removed.

In the case where the substrate was cooled in an atmosphere in which ethanol anhydride (substance having affinity with an immersion liquid) in a dry air, a dropwise condensation of the ethanol anhydride made in the protective film was detected, and it was found that the thus the dropwise condensation of the ethanol anhydride induced the immersion liquid into the protective film.

Figure 8A:
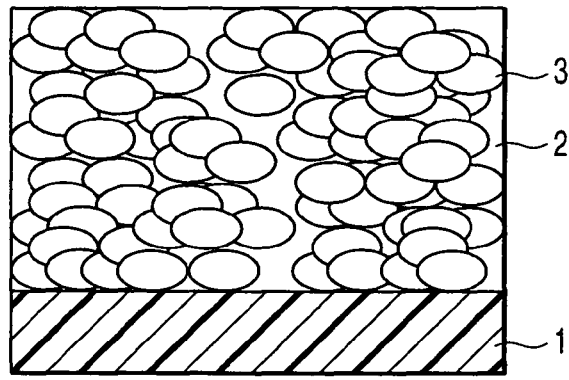
FIGS. 8A to 8C are drawings showing an internal state of a protective film in the case where a substrate is cooled in an atmosphere containing a substance which has affinity with an immersion liquid.
Figure 8B:
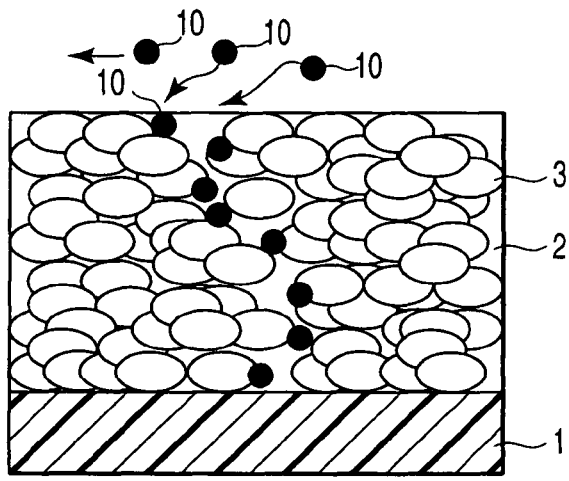
Figure 8C:
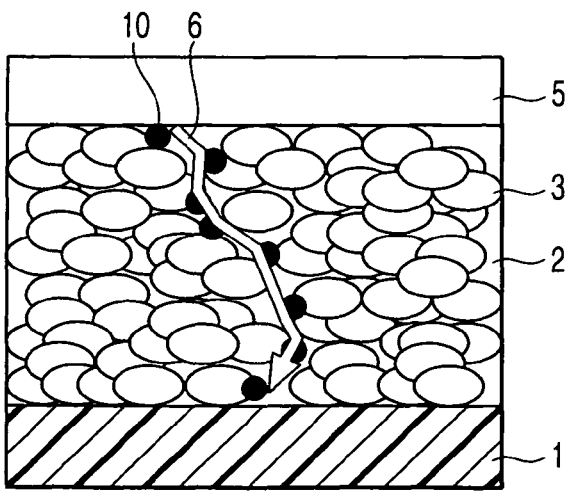

FIGS. 8A to 8C each show an internal state of the protective film between the step of cooling the substrate in the atmosphere containing a substance having affinity with the immersion liquid and the step of carrying out immersion exposure to the photo resist film. In FIGS. 8A to 8C, reference numeral 10 denotes a substance having affinity with the immersion liquid. References 1 to 6 shown in FIGS. 8A to 8C denote like elements shown in FIGS. 5A and 5B.

FIG. 8A shows the protective film 2 with the residual substance after baked (step S23b) in the present embodiment is removed therefrom. FIG. 8B shows a step of cooling a substance in an atmosphere containing the substance 10 having affinity with the immersion liquid. In this cooling step, the substance 10 having affinity with the immersion liquid enters a region (exit of a solvent) of the protective film 2 from which the residual substance is removed. FIG. 8C shows a step of immersion exposing for the photo resist film 1. In the immersion exposure step, the immersion liquid enters the protective film 2 by means of the substance 10 having affinity with the immersion liquid, and further, the immersion liquid 5 arrives at the surface of the photo resist film 1 by way of the passage 6.

Based on the above finding, the protective film after heated is cooled in an atmosphere (dry air) which contains no substance having affinity with the immersion liquid in the present embodiment, in order to restrict entry of an immersion liquid inductive substance into the protective film (step S23c).

Figure 9A:
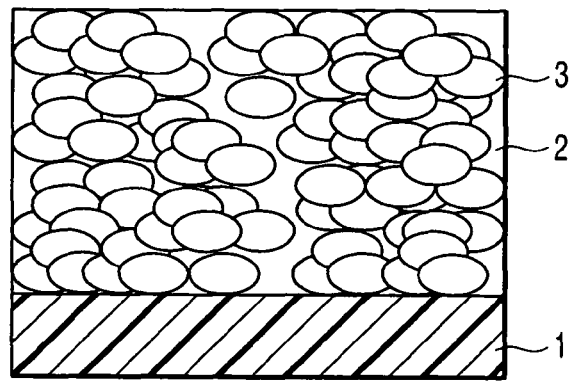
FIGS. 9A to 9C are drawings showing an internal state of a protective film in the case where a substrate has been cooled in an atmosphere containing a substance which has no affinity with an immersion liquid.
Figure 9B:
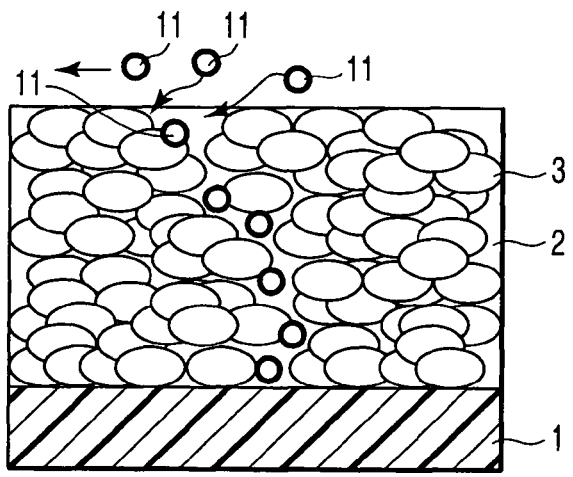
Figure 9C:
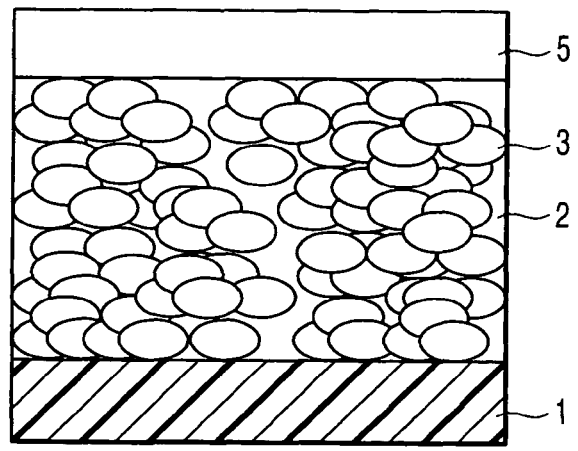

FIGS. 9A to 9C each show an internal state of the protective film from the step of cooling the substance in the atmosphere containing the substance having no affinity with the immersion liquid to the step of immersion exposing for the photo resist film. In FIGS. 9A to 9C, reference numeral 11 denotes a substance having no affinity with the immersion liquid 5 or a substance showing resistance against the immersion liquid 5. Reference numerals 1 to 6 shown in FIGS. 9A to 9C denotes like elements shown in FIGS. 5A and 5B.

FIG. 9A shows the protective film 2 with the residual substance after baked (step S23b) is removed therefrom. FIG. 9B shows a step of cooling the substance in an atmosphere containing the substance 11 having no affinity with the immersion liquid. In this cooling step, the substance 11 having no affinity with the immersion liquid enters a region (exit of a solvent) of the protective film 2 from which the residual substance is removed. FIG. 9C shows a step of immersion exposing for the photo resist film 1. In this immersion exposure step, the substance having affinity with the immersion liquid 5 does not exist in the protective film 2, and thus, the immersion liquid 5 does not enter the protective film 2.

In step S23b, the receding contact angle relevant to the surface of the protective film obtained by heating at 110° C. in the atmosphere that contains ethanol anhydride having a lower boiling point than the substance 11 having no affinity with the immersion liquid in the dry air was measured as 61° by expansion and contraction technique.

In contrast, a receding contact angle of the protective film obtained by heating in the atmosphere that contains ethanol anhydride having the lower boiling point in a dry air was 85°, and it was verified that the receding contact angle significantly increased.

When exposure was carried out while a liquid film was maintained in a local region including an exposed region at the time of immersion exposure, the residual liquid droplets occurred on the substrate in an exposure operation at the time of immersion exposure in the case where the receding contact angle was 61°. However, in the case where the receding contact angle after step S23c was 85°, the residual liquid droplets were not observed. Although the residual liquid droplets can cause the watermark defect, the risk was greatly reduced by this process (steps S23b and S23c).

When the residual liquid droplets were evaluated with respect to a variety of films, the residual liquid droplets were not observed when the receding contact angle was equal to or greater than 75°. Thus, it is preferable to control a concentration of an alcohol anhydride having a low boiling point contained in an atmosphere, a flow rate of the atmosphere, a pressure, a substrate temperature, and a processing time such that the receding contact angle is equal to or greater than 75°.

Immersion exposure is carried out by using a substrate having the thus processed protective film (step S26), and then, a resist pattern is formed through well known steps, namely, a post-exposure baking (PEB) step (step S28), a protective film removing step (step S29), and a photo resist film developing step (step S30).

When the thus formed resist pattern in the present embodiment was inspected, it was verified that the number of watermarks having occurred in a conventional process was reduced to several watermarks per wafer.

When, the resist pattern of the present embodiment is used as a mask, a hole pattern formed by sequentially etching the antireflection film (second film to be processed) and the oxide film (first film to be processed) was inspected, the number of defects was merely produced as several defects per wafer, and a good result was obtained. A device produced by filling the hole pattern with an inter-wire joining material, and by further performing a post-processing showed good reliability.

In the present embodiment, ethanol anhydride having a low boiling point was used in order to remove a substance that is affinitive with the immersion liquid caused by a solvent contained in the protective film in the baking atmosphere, however it is not limited thereto. By virtue of the same reason as that described in the first embodiment, while dehydrated and amine-removed methanol or isopropyl alcohol is contained in a dry air, dry helium, dry nitrogen or the like, the contained substance may be supplied to the surface of the protective film. In addition, the solvent contained in the protective film also includes like solvent according to the first embodiment.

Figure 10A:
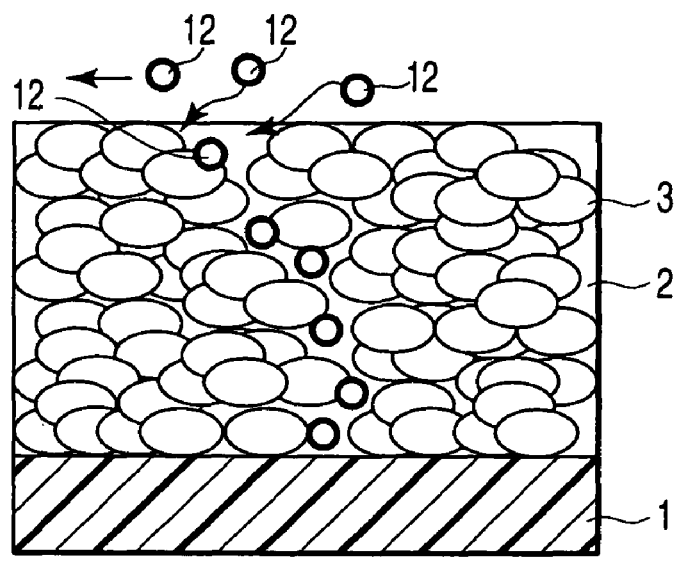
FIGS. 10A and 10B are drawings showing an internal state of a protective film in the case where a substance which has no affinity with an immersion liquid is applied on a surface of the protective film.
Figure 10B:
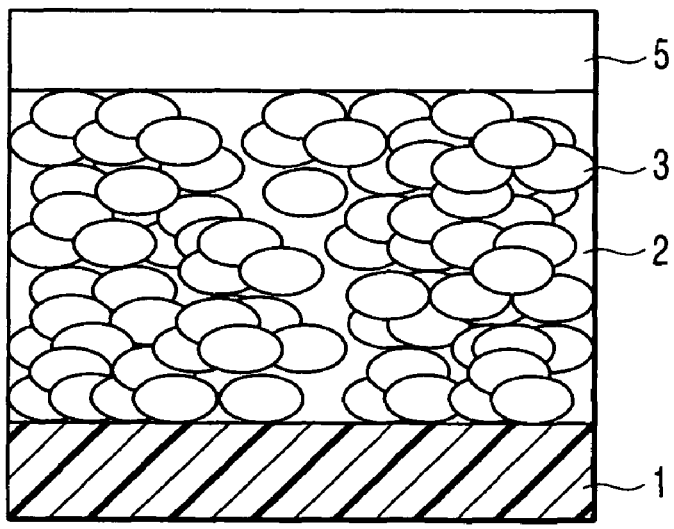

After the step (protective film cooling step) shown in FIG. 9B and before the step (immersion exposure step) shown in FIG. 9 in the above-described process, affinity with the immersion liquid 5 was successfully lowered more remarkably and the receding contact angle was successfully improved by, as shown in FIGS. 10A and 10B, applying the substance having no affinity with the immersion liquid or the substance 12 showing resistance against the immersion liquid, for example, a chlorofluorocarbon compound to act (physically adsorb) to the surface and the inside of the protective film 2.

Similarly, after the step (step of baking protective film) shown in FIG. 6B and before the step (immersion exposure step) shown in FIG. 6C in the first embodiment, affinity with the immersion liquid was successfully lowered more remarkably, and the receding contact angle was successfully improved by applying (physically adsorbing) the substance having no affinity with the immersion liquid to the surface of the protective film.

In the case where the surface of the protective film before immersion exposure is contaminated with fine particles, the surface of the protective film may be washed prior to immersion exposure (processing of protective film before exposure (step S25)).

In the case where exposure is carried out while a liquid film is maintained in a local region including an exposed region at the time of immersion exposure, a reforming process may be carried out for the surface of the protective film such that the liquid film does not splash out of the local region (processing of protective film before exposure (step S25)).

In addition, in the case where a liquid droplet has occurred on the protective film at the time of immersion exposure, such a liquid droplet may be removed immediately before carrying out post-exposure baking (step S28) in order to prevent an occurrence of a watermark or pattern dimension/shape failure (processing of protective film after exposure (step S27)).

While the present embodiment describes a case of using an exposure light beam having a wavelength 193 nm, it was verified that a watermark defect could be reduced in accordance with similar processing even when an exposure light beam having a wavelength 248 nm was used and water or an organic substance was used for an immersion liquid.

Moreover, even when an exposure light beam having a wavelength 157 nm was used and a fluorine-based organic substance was used for an immersion liquid, an effect capable of reducing a watermark defect in accordance with similar processing was verified.

Baking temperatures for the photo resist film and protective film are not limited to the values according to the present embodiment, and may be temperatures capable of attaining protecting characteristics depending on materials. It is desirable that the baking temperature of the protective film is lower than that of the photo resist film so as not to cause a substance in the photo resist film to move into the protective film.

The underlying layer processing step according to the present embodiment relates to the step of forming the hole of the oxide film, however it is not limited thereto. For example, this step can be applied to lithography step for all the device manufacturing steps such as wire formation, gate formation, active area formation, and ion implantation.

Fourth Embodiment

Figure 11:
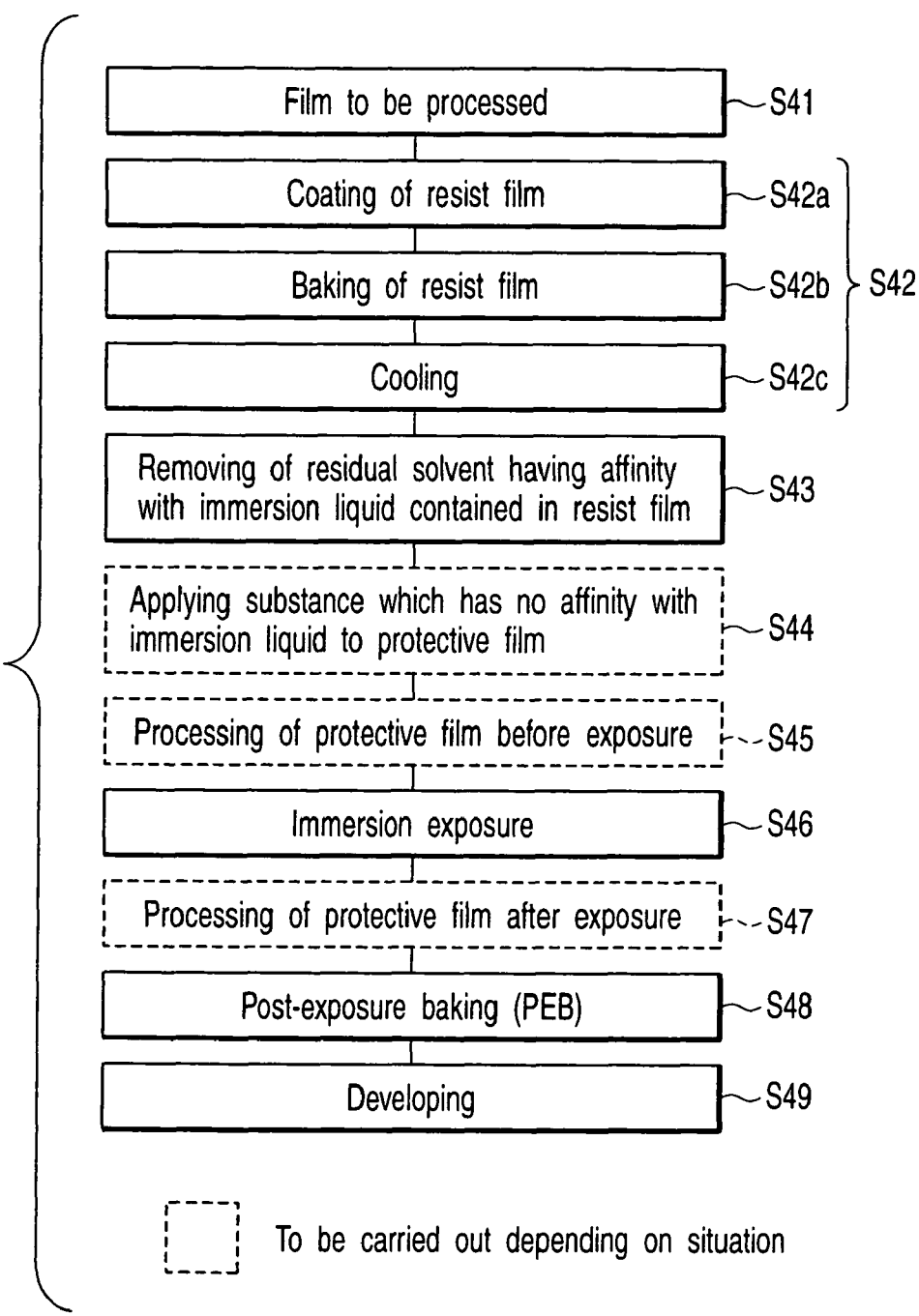
FIG. 11 is a process flow showing a method of forming a resist pattern of a fourth embodiment according to the present invention.

FIG. 11 is a process flow showing a method of forming a resist pattern in a fourth embodiment according to the present invention. The present embodiment describes a method of forming a resist pattern when a KrF excimer laser (wavelength 248 nm) is used as a light source and pure water is used as an immersion liquid.

First, a film to be processed is prepared (step S41). The film to be processed includes an oxide film (first film to be processed) and an antireflection film (second film to be processed) formed on the oxide film. The film to be processed (oxide film, antireflection film) is formed on a semiconductor substrate (wafer).

The step of forming the antireflection film includes a step of forming a film having an antireflection effect with respect to an exposure light beam (wavelength 248 nm) on the oxide film by spin coating method; and a step of baking the film.

Next, a photo resist film (first film) is formed on the film to be processed (step S42). The step of forming the photo resist film (step S42) includes a step (step S42a) of coating a photo resist material having photosensitivity with respect to an exposure light beam (wavelength 248 nm) on a film (antireflection film) obtained by cooling the baked film to be adjusted at a desired temperature; a step (step S42b) of baking for curing the photo resist film; and a step (step S42c) of cooling the cured photo resist film (heated photo resist film) by the baking.

The coating of photo resist film step (step S42a) includes: a step of dropping a photo resist solution on the film to be processed on the main surface of the semiconductor substrate; and a step of approximately removing a solvent of the photo resist solution while rotating the semiconductor substrate.

While this photo resist film was weak in permeability of an immersion liquid, slight entry was observed. Thus, a solvent having a portion which is affinitive with the immersion liquid (water) that remains in the resist film was removed without using a protective film (step S43).

Here, the solvent that remains in the photo resist film was ethyl lactate. Thus, while an atmosphere in which an isopropyl alcohol having a low boiling point is contained in a dry air applied to the photo resist film, the dry air was evaporated together with the isopropyl alcohol. The atmosphere (substance having no affinity with immersion liquid) was applied to the photo resist film after supplied to the surface of the photo resist film.

Here, since the boiling point of the isopropyl alcohol was 82, 4° C., an environment was established such that the substance applied to the photo resist film by heating the photo resist film to 95° C. easily evaporated.

In accordance with the processing (step S43), the ethyl lactate that remains in the photo resist film was successfully removed, and affinity with the immersion liquid in an exit of a solvent was greatly lowered. In addition, with the isopropyl alcohol steam, the surface of the photo resist film slightly dissolved, and a smoother surface was successfully obtained. The photo resist film was cooled in an atmosphere containing only a dry air (step S42c).

Prior to the step (step S43) of removing a substance having affinity with an immersion liquid from the photo resist film, a receding contact angle relevant to the surface of the photo resist film was measured as 55° in an expansion and contraction technique.

In contrast, with respect of the protective film having removed therefrom a substance having ethyl lactate after step S43, affinity with water was lowered, and the surface became smoother, whereby the receding contact angle significantly increased as 83°.

When exposure is carried out while a liquid film is maintained in a local region including an exposed region at the time of immersion exposure, the number of the residual liquid droplets occurred on the substrate in an exposure operation at the time of immersion exposure in the case where the receding contact angle was 55°. In the case where the receding contact angle was 83° after step S43, however, the residual liquid droplets were not observed. Although the residual liquid droplets can cause a watermark defect, the risk was greatly reduced in accordance with this processing (step S43).

When the residual liquid droplets were evaluated with respect to a variety of films, the residual liquid droplets were not observed when the receding contact angle was equal to or greater than 75°. Thus, it is preferable to control a concentration of an isopropyl alcohol contained in an atmosphere, a flow rate of the atmosphere, a pressure, a substrate temperature, and a processing time such that the receding contact angle is equal to or greater than 75°.

In addition, apart from the isopropyl alcohol, the receding contact angle was successfully set to equal to or greater than 75° by means of treatment with methanol (boiling point of 64.7° C. and proper baking temperature of 65° C. or higher) and ethanol (boiling point of 78.3° C. and proper baking temperature of 80° C. or higher).

Immersion exposure is carried out by using a substrate having the thus processed protective film (step S46), and then, a resist pattern is formed through well known steps, namely, a post-exposure baking (PEB) step (step S48) and a photo resist film developing step (step S49).

When the thus formed photo resist pattern in the present embodiment was inspected, it was verified that the number of watermarks having occurred in a conventional process was reduced to several watermarks per wafer.

When, with the resist pattern of the present embodiment using as a mask, a trench pattern formed by sequentially etching the antireflection film (second film to be processed) and the oxide film (first film to be processed) was inspected, the number of defects was merely produced as several defects per wafer and a good result was obtained. A device produced by filling the inside of the trench pattern with a wiring material, and by further performing a post-processing showed good reliability.

The present embodiment relates to an ethyl lactate solvent contained in a resist solvent. The target solvent is not limited thereto. The removing effect was verified also in an alcohol having another ester structure (for example, ethyl lactate: boiling point of 154° C.), and the like.

The target solvent will be a substance having an alcoholic OH group whose boiling point under normal pressure is approximately 100° C. or higher.

For example, substances having one alcohol OH group showed an effect of removing the residual substance from the inside of the protective film in the case where they have 4 carbons and having a OH group at position 1 such as 1-butanol, 1-pentanol, 2-pentanol, 3-pentanol, 2-hexanol, 3-hexanol, 1-heptanol, 2-heptanol, 3-heptanol, 4-heptanol, 1-octanol, 1-octanoil, 2-octanol, 2-octanbol, 3-octanol and 4-octanol and in the case where they have OH at the other position and having 5 carbons.

In addition, in substances having two or more alcoholic OH groups as well, a removing effect was observed, although it was less significant than these alcohols.

In the present embodiment, an isopropyl alcohol was used in order to remove the substance that is affinitive with the immersion liquid caused by a solvent contained in the photo resist film, however it is not limited thereto. The target substances are those having an alcoholic OH group whose boiling point under normal pressure is approximately less than 100° C. Dehydrated and amine-removed methanol and ethanol may be supplied to the surface of the protective film after they are contained in a dry air, dry helium, dry nitrogen or the like.

A reason why a dehydrating process and an amine-removing process are carried out with respect to an atmosphere and substances contained in the atmosphere is that, if exposure is carried out while these substances are contained, these substances are prevent from being reversibly adsorbed by an exit of a solvent, and these substances are prevented from being inductive substances of the immersion liquid and from being sources of producing watermarks.

It is preferable that an atmosphere in which the surface of the photo resist film is exposed from the heating using isopropyl alcohol to the ending film cooling is controlled so as not to contain a substance having affinity with an immersion liquid (substance chemically and physically adsorbed with moisture or alcohol and amine or water in the case where an immersion liquid is water or analogous organic substance in the case where an immersion liquid is an organic substance) (step S44). Desirably, exposure may be carried out in an atmosphere containing a dry air, dry helium, or dry nitrogen.

More desirably, More desirably, chemical reaction or physical adsorption may be carried out at the time of exposure to an atmosphere having no affinity with an immersion liquid (atmosphere containing a fluorine-based substance in the case where the immersion liquid is water and silazane compounds (hexamethyl silazane or tetramethyl silazane, etc.) or an atmosphere containing alcohol in the case where the immersion liquid is an organic substance).

In the case where affinity with an immersion liquid is caused by carrying out chemical reaction, affinitive substances may be removed again by applying the alcohol having a low boiling point as shown in the present embodiment after the processing or may be removed after the chemical reaction is carried out.

In the case where the surface of the photo resist film before immersion exposure is contaminated with fine particles, the surface of the resist film may be washed prior to immersion exposure (processing of resist film before exposure (step S45)).

In the case where exposure is carried out while a liquid film is maintained in a local region including an exposed region at the time of immersion exposure, a reforming process may be carried out for the surface of the photo resist film so as not to cause the liquid film to splash out of the local region (processing of photo resist film before exposure (step S45)).

In addition, in the case where a liquid droplet has occurred on the photo resist film at the time of immersion exposure, such a liquid droplet may be removed immediately prior to carrying out post-exposure balking (step S48) in order to prevent an occurrence of a watermark or a pattern dimension/shape failure (processing of photo resist film after exposure (step S47)).

The present embodiment describes a case of using the exposure light beam having a wavelength 193 nm. Even when an exposure light beam having a wavelength 248 nm was used and water or an organic substance was used for an immersion liquid, an effect capable of reducing a watermark defect in accordance with a similar process was verified.

Further, even when an exposure light beam having a wavelength 157 nm was used and a fluorine-based organic substance was used for an immersion liquid, an effect capable of reducing a watermark defect by a similar process was verified.

Baking temperature of the photo resist film is not limited to the value according to the present embodiment, and may be temperature capable of attaining characteristics of photo resist depending on materials.

The underlying layer processing step according to the present embodiment relates to the step of forming the trench of the oxide film, however it is not limited thereto. For example, this step can be applied to lithography step for all the device manufacturing steps such as contact hole formation, gate formation, active area formation, and ion implantation.

Fifth Embodiment

Figure 12:
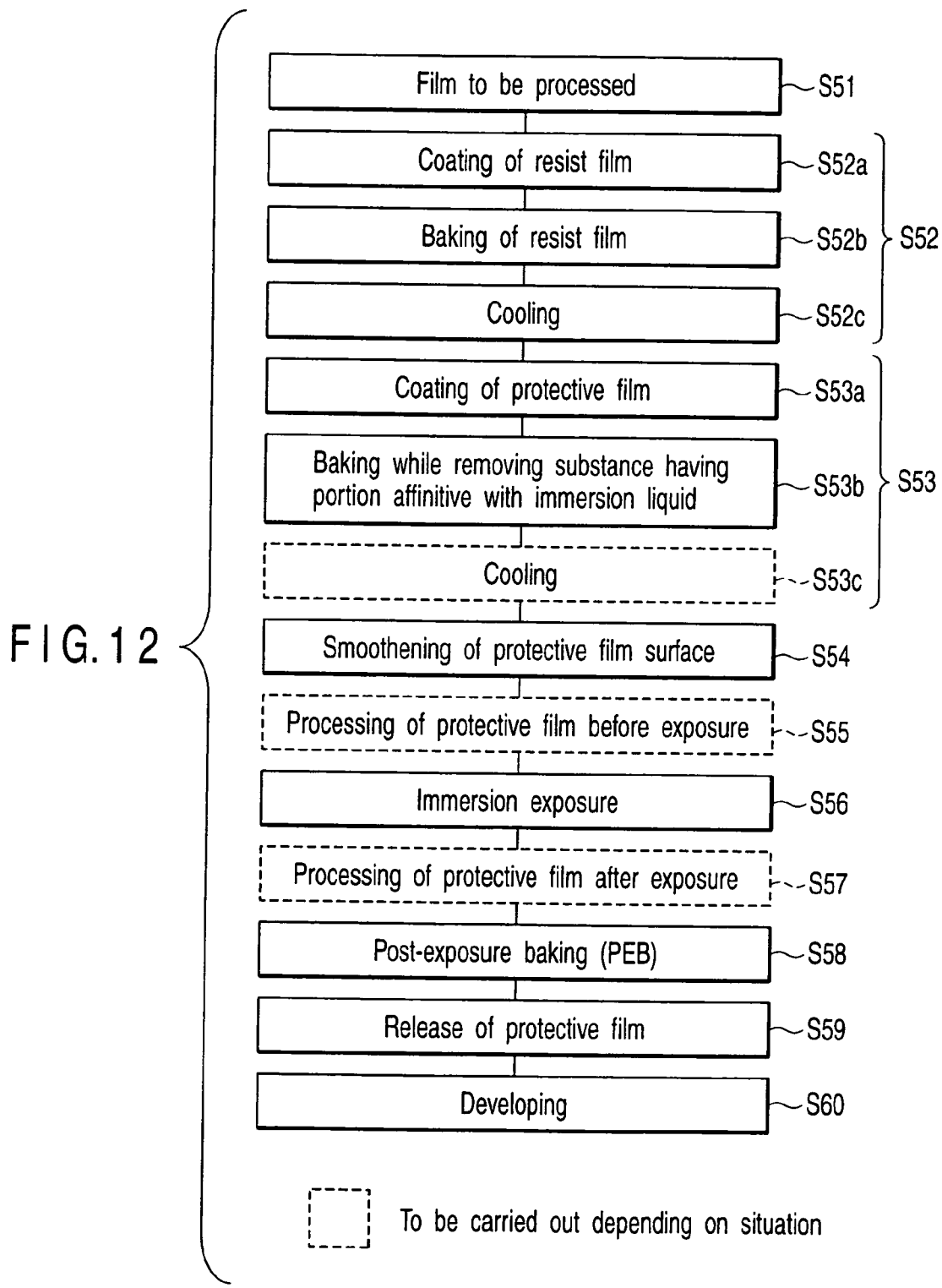
FIG. 12 is a process flow showing a method of forming a resist pattern of a fifth embodiment according to the present invention.

FIG. 12 is a process flow showing a method of forming a resist pattern in a fourth embodiment according to the present invention. The present embodiment describes a method of forming a resist pattern when a KrF excimer laser (wavelength 193 nm) is used as a light source and pure water is used as an immersion liquid.

First, a film to be processed is prepared (step S51). The film to be processed includes an oxide film (first film to be processed) and an antireflection film (second film to be processed) formed on the oxide film. The film to be processed (oxide film, antireflection film) is formed on a semiconductor substrate (wafer).

The step of forming the antireflection film includes a step of forming a film having an antireflection effect with respect to an exposure light beam (wavelength 193 nm) on the oxide film by spin coating method; and a step of baking the film.

Next, a photo resist film (first film) is formed on the film to be processed (step S52). The step of forming the photo resist film (step S52) includes a step (step S52a) of coating a resist material having photosensitivity with respect to an exposure light beam (wavelength 193 nm) on a film (antireflection film) obtained by cooling the baked film to be adjusted at a desired temperature; a step (step S52b) of baking for curing the photo resist film at 110° C.; and a step (step S52c) of cooling the cured photo resist film (heated photo resist film) by the baking.

The step of coating the photo resist (step S52a) includes a step of dropping a photo resist solution on the film to be processed on the main surface of the semiconductor substrate; and a step of approximately removing a solvent of the resist solution while rotating the semiconductor substrate.

Next, a protective film (second film) for preventing an immersion liquid from being absorbed into the photo resist film and a substance contained in the resist film from being eluted in the immersion liquid is formed on the photo resist film (first film)(step S53).

The step of forming the protective film (step S53) includes a step (step S53a) of coating a solution (protective film solution) containing a material for the protective film on the photo resist film; and a step (step S53b) of baking for curing the protective film solution (step S53c). If required (depending on the situation), the cured protective solution film (heated protective film) by the baking is cooled (step S53c).

The step of coating the protective film solution (step S53a) includes a step of dropping the protective film solution on the film to be processed on the main surface of the semiconductor substrate; and a step of approximately removing a solvent of the protective film solution while rotating the semiconductor substrate.

The step (step S53b) of baking for curing the protective film solution is carried out at 110° C. At this time, the solvent is removed from the protective film. With removal of the solvent, irregularities (fine irregularities) of about ±1 nm occurred on the surface of the protective film. When immersion exposure is carried out with the fine irregularities having occurred on the surface of the protective film, the immersion liquid is adsorbed to a recess portion, and the liquid is prone to remain at the time of step exposure. It was verified that a number of liquid droplets existed on the substrate after immersion exposure. In the case where the irregularities on the surface of the protective film were as large as ±2 nm, the immersion liquid splashed out of the substrate at the time of stepwise immersion exposure.

Therefore, in the present embodiment, smoothening of the surface of the protective film is carried out after the baking process (step S53b) for removing the solvent from the protective film (step S54).

The smoothening of the surface of the protective film was carried out after N-methyl 2-pyrolinodine steam was applied to the surface of the protective film while the substrate temperature was maintained at 110° C. After smoothing the surface of the protective film, the supply of the steam was stopped. Subsequently, N-methyl 2-pyrolinodine that remains on the surface of the protective film was removed by heat treatment, and then, the substrate was cooled.

The irregularities on the surface of the protective film obtained by these processes were ±0.2 nm. When immersion exposure was carried out for the protective film having the surface flattened, the residual liquid droplets or liquid splash at the time of step exposure was not observed, and no liquid droplets were observed on the substrate after exposure. According to this technique, an exit of a solvent produced as a result of removing the solvent from the protective film in the step of baking protective film (step S53b) is sealed so that the entry of the immersion liquid into the protective film is restricted.

In the case where the smoothening on the surface of the protective film was not carried out, the receding contact angle of the immersion liquid relevant to the surface of the protective film was measured as 65° by expansion and contraction technique. On the other hand, in the case where smoothening was carried out, the angle was properly obtained as 85°.

Immersion exposure is carried out by using a substrate having the thus processed protective film (step S56), and then, a resist pattern is formed through well known steps, namely, a post-exposure baking (PEB) step (step S58), a protective film removing step (step S59), and a photo resist film developing step (step S60).

When the thus formed resist pattern of the present embodiment was inspected, none of the watermarks having occurred in a conventional process was observed.

When, with the resist pattern of the present embodiment using as a mask, a trench pattern formed by sequentially etching the antireflection film (second film to be processed) and the oxide film (first film to be processed) was inspected, the number of defects was merely produced as several defects per wafer, and a good result was obtained. A device produced by filling the inside of the trench pattern with a wiring material, and by further performing a post-processing showed good reliability.

In the present embodiment, N-methyl 2-pyrolidinone steam was used to smoothen the protective film, however it is not limited thereto. When an effect was inspected with respect to a variety of protective films, a smoothening effect of almost of the protective films was successfully verified with respect to acetone steam, propylene glycol monomethyl ether acetate (PGMEA) steam, and N-methyl 2-pyrolidinone (NMP) steam.

In addition, a smoothening effect was successfully verified also in the case where the solvent contained in that solution was applied to a variety of protective films.

Moreover, substances having one alcohol OH group showed an effect of removing the residual substance from the inside of the protective film in the case where they have 4 carbons and having a OH group at position 1 such as 1-butanol, 1-pentanol, 2-pentanol, 3-pentanol, 2-hexanol, 3-hexanol, 1-heptanol, 2-heptanol, 3-heptanol, 4-heptanol, 1-octanol, 1-octanoil, 2-octanol, 2-octanbol, 3-octanol and 4-octanol and in the case where they have OH at the other position and having 5 carbons.

Although these substances can be applied as they are, a crater or dome-shaped film thickness variation occurs unpreferably when an excessive amount of these substances is supplied. In such a case, these substances may be diluted, and the diluted substances may be applied while it is contained in a dry air, dry helium, dry nitrogen or the like.

In the case where the surface of the protective film before immersion exposure is contaminated with fine particles, the surface of the protective film may be washed prior to immersion exposure (processing of protective film before exposure (step S55)).

In the case where liquid droplets have occurred on the protective film at the time of immersion exposure, the liquid droplets may be removed immediately prior to carrying out post-exposure baking (step S58) in order to prevent an occurrence of a watermark or pattern dimension/shape failure (processing of protective film after exposure (step S57)).

The present embodiment describes a case of using an exposure light beam having a wavelength 193 nm. Even when an exposure light beam having a wavelength 248 nm was used and water or an organic substance was used for an immersion liquid, an effect capable of reducing a watermark defect was successfully verified in accordance with a similar processing.

In addition, even when an exposure light beam having a wavelength 157 nm was used and a fluorine-based organic substance was used for an immersion liquid, an effect capable of eliminating the residual light droplets and reducing a watermark defect was verified by a similar processing.

Baking temperatures for the photo resist film and protective film are not limited to the values according to the present embodiment, and may be temperatures capable of attaining protecting characteristics depending on materials. It is desirable that the baking temperature for the protective film is lower than that for the photo resist film so as not to cause a substance in the photo resist film to move into the protective film.

The underlying layer processing step according to the present embodiment relates to a step of forming a trench of an oxide film, however it is not limited thereto. For example, this step can be applied to lithography step for all the device manufacturing steps such as contact hole formation, gate formation, active area formation, and ion implantation.

Sixth Embodiment

Figure 13:
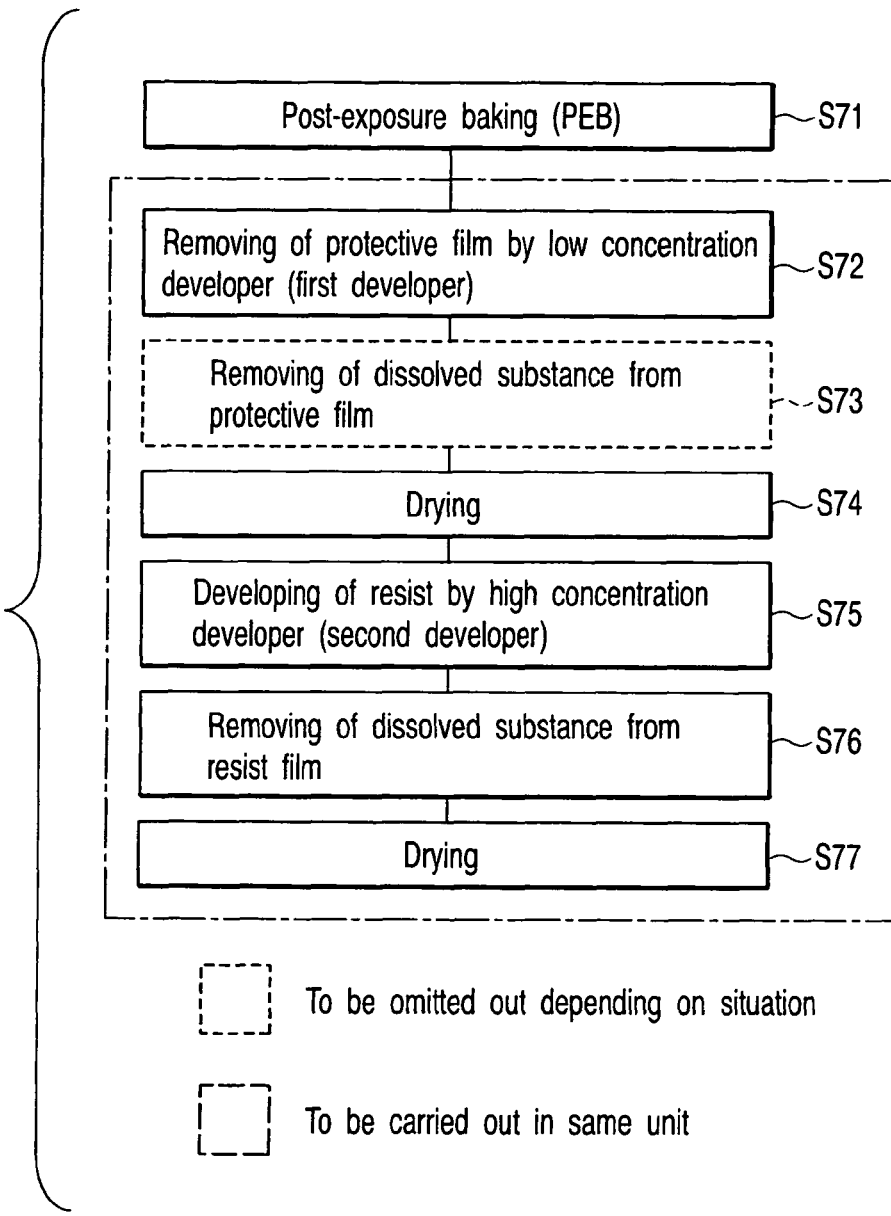
FIG. 13 is a process flow showing a method of forming a resist pattern of a sixth embodiment according to the present invention.

FIG. 13 is a process flow showing a method of forming a resist pattern in a sixth embodiment according to the present invention. The present embodiment describes a method of forming a resist pattern when a KrF excimer laser (wavelength 193 nm) is used as a light source and pure water is used as an immersion liquid.

First, a film to be processed is prepared. The film to be processed includes an oxide film (first film to be processed) and an antireflection film (second film to be processed) formed on the oxide film. The film to be processed (oxide film, antireflection film) is formed on a semiconductor substrate (wafer).

The step of forming the antireflection film includes a step of forming a film having an antireflection effect with respect to an exposure light beam (wavelength 193 nm) on the oxide film by spin coating method; and a step of baking the film.

Next, a photo resist film (first film) is formed on the film to be processed. The step of forming the photo resist film includes a step of coating a photo resist material having photosensitivity with respect to an exposure light beam (wavelength 193 nm) on a film (antireflection film) obtained by cooling the baked film to be adjusted at a desired temperature; a step of baking for curing the photo resist film at 110° C.; and a step of cooling the cured photo resist film (heated resist film) by the baking.

The step of coating the photo resist includes a step of dropping a resist solution on the film to be processed on the main surface of the semiconductor substrate; and a step of approximately removing a solvent of the photo resist solution while rotating the semiconductor substrate.

Next, a protective film (second film) for preventing an immersion liquid from being absorbed into the photo resist film and a substance contained in the resist film from being eluted in the immersion liquid is formed on the photo resist film (first film). The protective film is soluble in alkali.

The step of forming the protective film includes a step of coating a solution (protective film solution) containing a material for the protective film on the photo resist film; and a step of baking for curing the protective film solution. If required (depending on the situation), the cured protective solution film (heated protective film) by the baking is cooled.

The step of coating a protective film solution includes a step of dropping a protective film solution on the film to be processed on the main surface of the semiconductor substrate; and a step of approximately removing a solvent of the protective film solution while rotating the semiconductor substrate.

The step of baking for curing the protective film solution is carried out at 110° C. At this time, the solvent is removed from the protective film.

The smoothening of the surface of the protective film was carried out after N-methyl 2-pyrolinodine steam was applied to the surface of the protective film while the substrate temperature was maintained at 110° C. After smoothing the surface of the protective film, the supply of the steam was stopped. Subsequently, N-methyl 2-pyrolinodine that remains on the surface of the protective film was removed by heat treatment, and then, the substrate was cooled. The irregularities on the surface of the protective film obtained by these processes were ±0.2 nm.

Next, immersion exposure is carried out by using a substrate having the thus processed protective film, and then, a post-exposure baking (PEB) step (step S71) is carried out.

In the prior art, with respect to an alkali soluble protective film, the protective film and resist film have been developed altogether by using a developer having the same concentration as that used for developing the photo resist film.

However, since the protective film and photo resist film are eluted, there has been a problem that a defect occurs due to interaction of these films.

In addition, in the case where a dissolution rate of the protective film of the photo resist film is slow, there has been a problem that the uniformity of dimensions of the resist pattern is impaired and no pattern is resolved as an image.

Therefore, the following process is carried out in the present embodiment.

The protective film is removed while rotating the substrate by using a first developer (aqueous solution of tetra methyl ammonium oxide) obtained by diluting the developer when pH=12.5 (step S72).

At this time, in order to carry out the removing of the protective film within a short period of time, the first developer is used while a liquid supply nozzle is moved in a radial direction on the substrate.

At a stage at which the protective film has dissolved and the photo resist film has been exposed, the supply of the first developer is stopped. While pure water is supplied from the same liquid supply nozzle and nozzle movement in the radial direction and substrate rotation are carried out, an eluted substance of the protective film is removed from the substrate (step S73).

Next, rotational drying is carried out at 1800 rpm at which the air flow on the substrate does not become a turbulent flow on the outer circumference of the substrate (step S74).

Next, a second developer of pH 13.8 is continuously supplied in the same unit as that used for removal of the protective film (step S75), and an eluted substance of the photo resist film is removed (step S76).

Thereafter, a drying process is carried out (step S77), and a resist pattern is completed.

When, with the thus formed resist pattern of the present embodiment using as a mask, a trench pattern formed by sequentially etching the antireflection film (second film to be processed) and the oxide film (first film to be processed) was inspected, the number of defects was merely produced as several defects per wafer, and a good result was obtained. A device produced by filling the inside of the trench pattern with a wiring material and by further performing a post-processing showed good reliability.

In the present embodiment, the protective film was removed by supplying the first developer having a comparatively low concentration and dissolving the protective film, and thereafter, a resist pattern is formed by drying the substrate and supplying the second developer onto the substrate (photo resist film), however it is not limited thereto. The resist pattern may be formed by supplying the second developer immediately after the protective film has dissolved.

In addition, the concentration of the first developer is not limited thereto, and any alkaline solution may be used as long as it has a concentration (alkali concentration) at which the protective film dissolves and the photo resist film hardly dissolves. In addition, any concentration of the second developer may be used as long as it is a concentration (alkali concentration) at which the photo resist film is developed and which is higher than that of the first developer.

Further, in the case where a liquid droplet has occurred on the protective film at the time of immersion exposure, such a liquid droplet may be removed immediately prior to carrying out post-exposure baking in order to prevent a watermark or pattern dimension/shape failure (processing of protective film after exposure).

When the dissolution compound that is produced during the first development process dose not affect to second development process, the step S73 and step S74 can be skipped.

The underlying layer processing step according to the present embodiment relates to a step of forming a trench of an oxide film without being limited thereto. For example, this step can be applied to lithography step for all the device manufacturing steps such as contact hole formation, gate formation, active area formation, and ion implantation.

In addition, a semiconductor device is manufactured by forming a resist pattern on a substrate including a semiconductor substrate by the method of any of the above mentioned embodiments, then, etching the substrate using the resist pattern as a mask. The semiconductor substrate is, for instance, a silicon substrate or an SOI substrate.

Here, in the case where an underlying layer of the resist pattern (i.e. uppermost layer of the substrate) is a polycrystalline silicon film or a metal film, a fine electrode pattern or wiring pattern or the like is formed. In the case where the underlying layer of the resist pattern (i.e. uppermost layer of the substrate) is an insulating film, a fine contact hole pattern or a gate insulating film or the like is formed. In the case where the underlying layer of the resist pattern is the above-mentioned semiconductor substrate, a fine isolation trench (STI: shallow trench isolation) is formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming method comprising:
    forming a photo resist film on a film to be processed;
    forming a protective film for protecting the photo resist film from an immersion liquid on the photo resist film by coating method;
    performing immersion exposure selectively to a region of part of the photo resist film via the immersion liquid, the immersion liquid being supplied onto the photo resist film;
    removing a residual substance including an affinitive part for the immersion liquid from the protective film after the forming the protective film and before the performing immersion exposure selectively to the region of part of the photo resist film, the removing the residual substance comprising applying a first solvent whose boiling point is lower than that of a second solvent which is included in the immersion liquid and remained in the protective film; and thereafter baking the protective film, or the removing the residual substance comprising baking the protective film during applying the first solvent whose boiling point is lower than that of the second solvent;
    removing the protective film; and
    forming a pattern comprising the photo resist film by selectively removing an exposed region or a non-exposed region of the photo resist film.

2. The pattern forming method according to claim 1, wherein the first solvent is prepared by adding a solvent whose boiling point is lower than that of the second solvent into an atmosphere having no affinity with the immersion liquid.

3. The pattern forming method according to claim 1, wherein the baking is carried out at a higher temperature than the boiling point of the first solvent.

4. A method of manufacturing a semiconductor device, comprising:
    forming a resist pattern on a substrate including a semiconductor substrate, the resist pattern being formed by pattern forming method, the pattern forming method comprising:
        forming a photo resist film on a film to be processed;
        forming a protective film for protecting the photo resist film from an immersion liquid on the photo resist film by a coating method;
        performing immersion exposure selectively to a region of part of the photo resist film via the immersion liquid, the immersion liquid being supplied onto the photo resist film;
        removing a residual substance including an affinitive part for the immersion liquid from the protective film after the forming the protective film and before the performing immersion exposure selectively to the region of part of the photo resist film;
        removing the protective film; and forming a pattern comprising the photo resist film by selectively removing an exposed region or a non-exposed region of the photo resist film,
wherein the removing the residual substance comprises applying a first solvent whose boiling point is lower than that of a second solvent which is included in the immersion liquid and remained in the protective film, and thereafter baking the protective film, or the removing the residual substance comprising baking the protective film during applying the first solvent whose boiling point is lower than that of the second solvent; and forming a pattern by etching the substrate using the resist pattern as a mask.

* * * * *